(12) United States Patent
Mirkin et al.

(10) Patent No.: US 7,954,166 B2
(45) Date of Patent: May 31, 2011

(54) INDEPENDENTLY-ADDRESSABLE, SELF-CORRECTING INKING FOR CANTILEVER ARRAYS

(75) Inventors: Chad A. Mirkin, Wilmette, IL (US);
Yuhuang Wang, Evanston, IL (US);
Louise R. Giam, Chicago, IL (US);
Matthew Park, Evanston, IL (US)

(73) Assignee: Northwestern University, Evanston, IL (US)

( * ) Notice: Subject to any disclaimer, the term of this patent is extended or adjusted under 35 U.S.C. 154(b) by 240 days.

(21) Appl. No.: 12/222,464

(22) Filed: Aug. 8, 2008

(65) Prior Publication Data
US 2009/0133169 A1 May 21, 2009

Related U.S. Application Data

(60) Provisional application No. 61/055,028, filed on May 21, 2008, provisional application No. 61/047,630, filed on Apr. 24, 2008, provisional application No. 60/954,732, filed on Aug. 8, 2007.

(51) Int. Cl.
*G01Q 60/38* (2010.01)
(52) U.S. Cl. ............... 850/40; 850/55; 850/56; 850/60; 850/21; 850/19; 850/33; 427/256; 427/287; 427/261; 427/265; 427/266; 427/269
(58) Field of Classification Search .............. 850/40, 850/56, 55, 60, 21, 19, 33; 506/15, 16; 250/306, 250/311; 530/345, 391; 346/140.1; 427/256, 427/287, 261, 265, 266, 269
See application file for complete search history.

(56) References Cited

U.S. PATENT DOCUMENTS

| | | | |
|---|---|---|---|
| 4,626,501 | A | 12/1986 | Landis |
| 5,021,364 | A | 6/1991 | Akamine et al. |
| 5,443,791 | A | 8/1995 | Cathcart |
| 5,705,814 | A | 1/1998 | Young |
| 5,965,721 | A | 10/1999 | Cook et al. |
| 5,981,733 | A | 11/1999 | Gamble et al. |
| 6,379,932 | B1 | 4/2002 | Arnold |

(Continued)

FOREIGN PATENT DOCUMENTS

WO WO 2004/105046 12/2004
(Continued)

OTHER PUBLICATIONS

*A Primer of Genome Science*, Gibson and Muse, "Gene Expression and the Transcriptome", Chptrs. 3-4, pp. 123-181 (2002).

(Continued)

*Primary Examiner* — Jack I Berman
*Assistant Examiner* — Meenakshi S Sahu
(74) *Attorney, Agent, or Firm* — Foley & Lardner LLP

(57) ABSTRACT

An improved method of loading tips and other surfaces with patterning compositions or inks for use in deposition. A method of patterning is described, the method comprising: (i) providing at least one array of tips; (ii) providing a plurality of patterning compositions; (iii) ink jet printing at least some of the patterning compositions onto some of the tips; and (iv) depositing at least some of the patterning compositions onto a substrate surface; wherein the ink jet printing is adapted to prevent substantial cross-contamination of the patterning composition on the tips. Good printing reproducibility and control of printing rate can be achieved. The surfaces subjected to ink jet printing can be treated to encourage localization of the ink at the tip. The method is particularly important for high density arrays.

109 Claims, 13 Drawing Sheets
(13 of 13 Drawing Sheet(s) Filed in Color)

U.S. PATENT DOCUMENTS

| | | |
|---|---|---|
| 6,410,231 B1 | 6/2002 | Arnold |
| 6,573,369 B2 | 6/2003 | Henderson |
| 6,635,311 B1 | 10/2003 | Mirkin et al. |
| 6,642,129 B2 | 11/2003 | Liu et al. |
| 6,787,313 B2 | 9/2004 | Morozov |
| 6,827,979 B2 * | 12/2004 | Mirkin et al. ................. 427/256 |
| 6,867,443 B2 | 3/2005 | Liu et al. |
| 6,949,985 B2 | 9/2005 | Qiu et al. |
| 6,998,228 B2 | 2/2006 | Henderson et al. |
| 7,005,378 B2 | 2/2006 | Crocker et al. |
| 7,008,769 B2 | 3/2006 | Henderson et al. |
| 7,034,854 B2 | 4/2006 | Cruchon-Dupeyrat et al. |
| 7,247,895 B2 | 7/2007 | Liu et al. |
| 2002/0122873 A1 | 9/2002 | Mirkin et al. |
| 2003/0005755 A1 | 1/2003 | Schwartz |
| 2003/0007242 A1 | 1/2003 | Schwartz |
| 2003/0068446 A1 | 4/2003 | Mirkin et al. |
| 2003/0162004 A1 | 8/2003 | Mirkin et al. |
| 2003/0185967 A1 | 10/2003 | Eby et al. |
| 2004/0008330 A1 | 1/2004 | Mirkin et al. |
| 2004/0026681 A1 | 2/2004 | Cruchon-Dupeyrat et al. |
| 2004/0101469 A1 | 5/2004 | Demers |
| 2004/0175631 A1 | 9/2004 | Crocker et al. |
| 2005/0009206 A1 | 1/2005 | Mirkin et al. |
| 2005/0035983 A1 | 2/2005 | Cruchon-Dupeyrat et al. |
| 2005/0235869 A1 | 10/2005 | Cruchon-Dupeyrat et al. |
| 2005/0255237 A1 | 11/2005 | Zhang et al. |
| 2005/0266149 A1 | 12/2005 | Henderson |
| 2005/0272885 A1 | 12/2005 | Mirkin et al. |
| 2006/0014001 A1 | 1/2006 | Mirkin et al. |
| 2006/0242740 A1 | 10/2006 | Collier et al. |
| 2007/0129321 A1 | 6/2007 | Mirkin et al. |
| 2008/0105042 A1 | 5/2008 | Mirkin et al. |

FOREIGN PATENT DOCUMENTS

| | | |
|---|---|---|
| WO | WO 2005/115630 | 12/2005 |

OTHER PUBLICATIONS

Bottomley, L. A., "Scanning Probe Microscopy", Anal. Chem. vol. 70, pp. 425R-475R (1998).
U.S. Appl. No. 10/375,060, filed Feb. 28, 2003, Dupeyrat et al.
U.S. Appl. No. 10/307,515, filed Dec. 2, 2002, Mirkin et al.
U.S. Appl. No. 11/690,738, filed Mar. 23, 2007, Mirkin et al.
Calvert, P., "Inkjet Printing for Materials and Devices", Chem. Mater., vol. 13, pp. 3299-3305 (2001).
Chen, H., et al., "Moving From Microarrays Toward Nanarrays", Methods in Molecular Biol., vol. 381, pp. 411 (2007).
Christman, K. L., et al., "Nanopatterning proteins and peptides", Soft Mater., vol. 2, pp. 928-939 (2006).
De Gans, B-J., et al., "Ink-jet Printing Polyers and Polymer Libraries Using Micropipettes", Macromol. Rapid Commun., vol. 25, pp. 292-296 (2004).
*Direct-Write Technologies, Sensors, Electronics, and Integrated Power Sources*, Pique and Chrisey (Eds.) (2002).
*Enzyme Structure and mechanism*, $2^{nd}$ Ed., Chptr. 15, Alan Fersht (1977).
Ginger et al., "The Evolution of Dip-Pen Nanolithography," Angew. Chem. Int. Ed., vol. 43, pp. 30-45 (2004).
Hong et al., " ", Science, vol. 286, pp. 523-525 (1999).
Kargupta, K., et al., "Templating of Thin Films Induced by Dewetting on Patterned Surfaces", Phys. Rev. Lett., vol. 86, pp. 4536-4539 (2001).
Lee, K-B., et al., "The Use of Nanoarrays for Highly Sensitive and Selective Detection of Human Immunodeficiency Virus Type 1 in Plasma", Nano Letts., vol. 4, pp. 1869-1872 (2004).
Lee, M., et al., "Protein nanoarray on Prolinker™ surface constructed by atomic force microscopy dip-pen nanolithography for analysis of protein interaction", Proteomics, vol. 6, pp. 1094-1103 (2006).
Lehninger, A. L., "Proteins and Their Biological Functions: A Survey," Biochemistry, pp. 55-66 (1970).
Lenhart, S., et al., "Massively Parallel Dip-Pen Nanolithography of Heterogeneous Supported Phospholipid Multilayer Patterns", Small, vol. 3, No. 1, pp. 71-75 (2007).
Love, J. C., et al., "Self-Assembled Monolayers of Thiolates on Metals as a Form of nanotechnology", Chem. Rev., vol. 105, pp. 1103-1169 (2005).
Madou, Fundamentals of Microfabrication, Cartmill, et al.,Chptr. 3, CRC Press LLC, pp. 123-181 (2002).
*Molecular Biology of the cell*, $3^{rd}$ Ed., Chptr. 2, Alberts et al. (Eds), Garland publishing (1994).
Mossman, K. D., et al., "Altered TCR Signaling from Geometrically Repatterned Immunological synapses", Science, vol. 310, pp. 1191-1193 (2005).
*Organic Chemistry*, $3^{rd}$ Ed., Chptr. 21, the Benjamin/Cummings publishing co. (1995).
*Organic Chemistry*, $6^{th}$ Ed., Chptr. 33, Morrison and Boyd (Eds), Prentice Hall (1992).
Peterson, E. J., et al., "Effect of Environmental Conditions on Dip Pen Nanolithography of Mercaptohexadecanoic", J. Phys. Chem. B, vol. 108, pp. 15206-15210 (2004).
Piner, R. D., et al., "'Dip-Pen' Nanolithography", vol. 283, pp. 661-663 (1999).
Principles of Cellular Engineering: Micromechanics at the Biomolecular Interface, "Model Cell Membrane Surfaces for Measuring Receptor-Ligand Interactions", (Ed: M. . King), Elsevier, pp. 195-211 (2006).
Rosner, B., et al., "Functional extensions of Dip Pen Nanolithography™: active probes and microfluidic ink delivery", Smart Mater. Struct., vol. 15, pp. S124-S130 (2006).
Rozhok, S., et al., "Dip-Pen Nanolithography: What Controls Ink Transport", J. Phys. Chem.. B, vol. 107, pp. 751-757 (2003).
Salaita, K., et al., "Massively Parallel Dip-Pen Nanolithography with 55000-Pen Two-Dimensional Arrays", Agnew Chem. In. Ed., vol. 45, pp. 7220-7223 (2006).
Salaita, K., et al., "Application of dip-pen nanolithography", Nature Nanotech., vol. 2, pp. 145-155 (2007).
Sehgal, A., et al., "Pattern-Directed Dewetting of Ultrathin Polymer Films", Langmuir, vol. 18, pp. 7041-7048 (2002).
Sirringhaus, H., et al., "Inkjet Printing of Functional Materials", MRS Bull. vol. 28, pp. 802-80603).
Stevens, M. M., et al., "Exploring and Engineering the Cell Surface Interface", Science, vol. 310 pp. 1135-1138 (2005).
*The Molecule and How it Works*, $2^{nd}$ Ed., "Understanding DNA," Calladine and Drew (1977).
Valiokas, R., et al., "Selective Recruitment of Membrane Protein Complexes onto Gold Substrates Patterned by Dip-Pen Nanolithography", Langmuir, vol. 22, pp. 3456-3460 (2006).
Wang, Y., et al., "Controlling the shape, orientation, and linkage of carbon nanotube features with nano affinity templates", Proc. Nat. Acad. Sci., vol. 103, pp. 2026-2031 (2006).
Wang, Y., et al., "A Self-Correcting Inking Strategy for Cantilever Arrays Addressed by an Inkjet Printer and Used for Dip-Pen Nanolithography," Small, vol. 4, No. 10, 1666-1670 (published online Jul. 24, 2008).
Wingren, C., et al., "Mega-Dense Nanoarrays: The Challenge of Novel Antibody Microarray Formats", Protein Microarrays, vol. 339-352 (2005).
Zaugg, F. G., et al., "Drop-on-Demand Printing of Protein Biochip Arrays", MRS Bull., vol. 28, pp. 837-842 (2003).
Zou, J., et al., "A mould-and-transfer technology for fabricating scanning probe microscopy probes", Micromech. Microeng., vol. 14, pp. 204-211 (2004).

* cited by examiner

INDEPENDENTLY-ADDRESSABLE, SELF-CORRECTING INKING FOR CANTILEVER ARRAYS

RELATED APPLICATIONS

This application claims priority to U.S. Provisional Ser. Nos. 61/055,028 filed May 21, 2008; 61/047,630 filed Apr. 24, 2008; and 60/954,732 filed Aug. 8, 2007, the entire disclosures of which are hereby incorporated by reference in their entireties.

FEDERAL FUNDING STATEMENT

Embodiments described herein were developed with the following grants: the Air Force Office of Scientific Research grant no. FA 9550-08-1-0124 and National Science Foundation (NSF), grant number EEC-0647560. The federal government has rights in the invention.

BACKGROUND

Cited references are listed later in this patent application.

Dip-Pen Nanolithography printing allows one to directly print a wide variety of materials including biomaterials including, for example, DNA, phospholipids and proteins on a surface with high-registry and sub-50 nm resolution.[1-3] The development of massively parallel DPN has substantially increased the throughput of DPN through the use of two-dimensional (2D) pen arrays comprising as many as 55,000 AFM cantilevers per $cm^2$.[4,5] Nevertheless, facile multiplexing, or the ability to simultaneously generate structures made of different materials, still is a challenge in developing a suite of DPN-based nanofabrication tools. Additionally, inconsistent and non-uniform inking from the solutions onto the writing instrument can in some cases hinder advancement of DPN for a particular application.

Hong et al. first demonstrated the direct DPN patterning of two different inks, 16-mercaptohexadecanoic acid (MHA) and 1-octadecanethiol (ODT) with high registry using different tips in a serial process.[16] This approach can provide in some cases insufficient control over the diffusion rates of the two inks and the corresponding linewidths of the nanostructures generated in the experiment. Later, researchers developed microscopic inkwells that can be filled with various inks through integrated microfluidic channels. See for example U.S. Pat. No. 7,034,854. These inkwells are used to address the different pens in a one-dimensional (1D) cantilever array for simultaneous DPN patterning of multiple inks from a single pen array.[17] This technique allows one to ink a linear pen array with up to 8 different inks in a single step, depending on the number of available inkwells.[18] Although this approach works well for many applications including some research applications where a few inks are being integrated in the context of a linear cantilever comprised of relatively few pens, the method is not directly scalable to 2D arrays consisting of thousands or even millions of pens. For instance, such an inkwell chip containing 55,000 individually addressable ink wells in one $cm^2$ might need more than 0.5 $m^2$ just to accommodate the area occupied by the ink reservoirs.

Such capabilities are desirable because they may allow researchers to, for example: (i) fabricate nanoarrays[6-10] with unprecedented chemical and biochemical complexity; (ii) control materials assembly through the use of affinity templates[11,12] such that each patterned feature controls the placement of different building blocks for making higher-ordered architectures; and (iii) develop an understanding of multivalent interactions between patterned surfaces and proteins, viruses, spores, and cells on a length scale that is biologically meaningful.[13-15] Methods for multiplexing in the context of a DPN experiment thus far have been in general limited due to the challenges associated with addressing and inking each pen of an array with different molecules.

Therefore, a need exists to develop an inking technique that allows one, for example, to coat more uniformly substantially the same amount of ink to different pens within an array, to control the diffusion rates of the different molecules in the ink, and to ink each pen within an array with independent addressability.

SUMMARY

Provided herein are methods of printing or deposition of inks, and preparing printers for printing, as well as devices for printing and methods of using printers and inking.

One embodiment provides a method comprising: providing at least one array of tips; providing at least two patterning compositions different from each other; ink jet printing at least two of the different patterning compositions onto at least some of the tips; and depositing at least some of the ink jet printed patterning compositions onto a substrate surface; wherein the array of tips and the ink jet printing are adapted to prevent substantial cross-contamination of the patterning composition on the tips.

Another embodiment provides a method comprising: ink jet printing at least one patterning composition onto at least one tip; and depositing the ink jet printed patterning composition onto a substrate surface at a deposition rate; wherein the conditions for ink jet printing are adapted to control the rate of deposition.

Another embodiment provides a method comprising: ink jet printing at least one patterning composition onto at least one array of tips comprising at least two tips; and depositing the patterning composition from the tips onto a substrate surface to form a plurality of features; wherein the conditions for ink jet printing are adapted to control the variability of deposition rate in the array of tips.

Another embodiment provides a method comprising: providing a contact printer surface, disposing at least one patterning composition onto the contact printer surface; and depositing at least some of the disposed patterning composition from the contact printer surface to a substrate; wherein the contact printer surface is treated so as to encourage the localization of the patterning composition to a desired location on the surface.

Another embodiment provides a method comprising: ink jet printing at least one patterning composition onto at least one tip in at least one array, wherein the tip has been treated to encourage localization of the patterning composition on the tip.

Another embodiment provides device comprising an array of cantilevers, the cantilevers having a tip thereon, wherein the cantilevers and tip are adapted to encourage localization of a deposited ink jet drop onto the tip.

Another embodiment is a method comprising: providing an ink well, disposing at least one patterning composition onto the ink well surface; and wherein the ink well surface is treated so as to encourage the localization of the patterning composition to a desired location on the surface.

In particular embodiments, an approach is provided to inking pen arrays that addresses the multiplexed inking challenge in the context of DPN and related nanolithographies is herein provided. In particular, the tips of the pens within 1D or 2D arrays can be independently addressed with different chemically distinct inks using an inkjet printer. In addition, a technique to modify the surface of the tips in the pen arrays is described, the technique being directing the droplets of inks to the tips of the cantilevers. This method of delivery ink (or "patterning composition") can provide in some embodiments control over the inking process and can transform DPN into a general nanofabrication tool that uniquely combines high throughput, high resolution, and multiplexing capabilities.

At least one advantage of at least one embodiment herein is better control over the printing process including better reproducibility, better control over ink printing rates, and avoidance of cross-contamination.

BRIEF DESCRIPTION OF THE FIGURES

The patent or application file contains at least one drawing executed in color. Copies of this patent or patent application publication with color drawing(s) will be provided by the Office upon request and payment of necessary fee.

DETAILED DESCRIPTION

Figure 1:
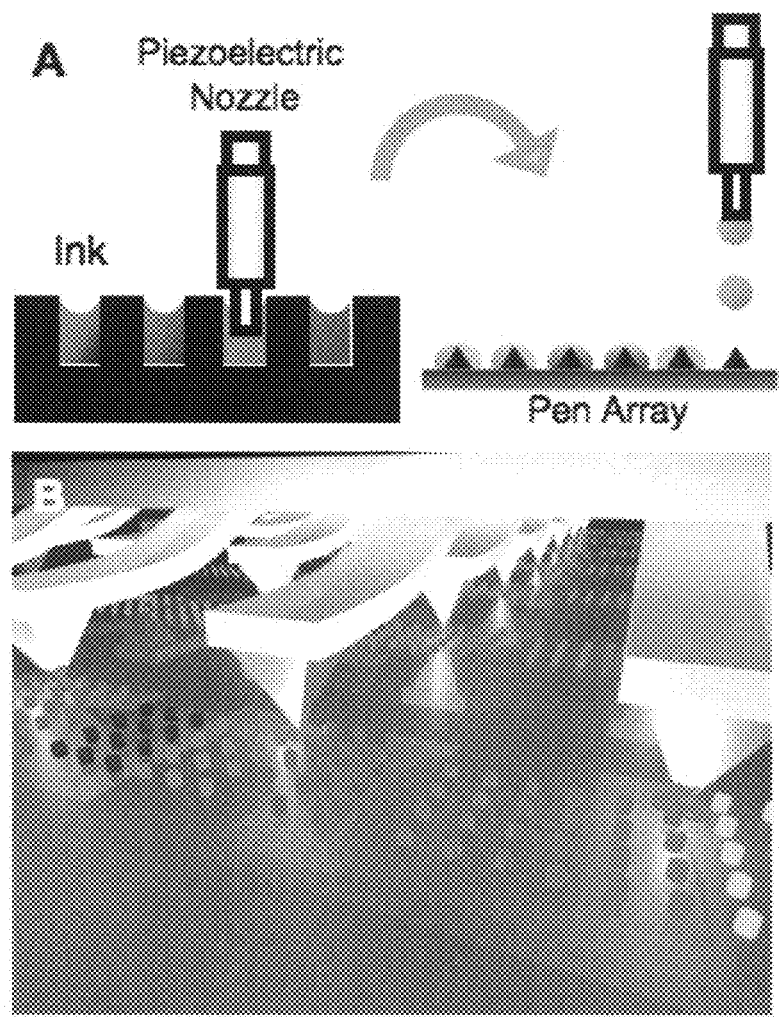
FIGS. 1A-1B show schemes for (A) addressable inking of pen arrays by inkjet printing and (B) multiplexed Dip-Pen Nanolithography.

All publications, patent applications, and patents mentioned herein are incorporated by reference in their entirety, including figures, claims, working examples, and supporting information.

Introduction

All references cited herein are hereby incorporated by reference in their entireties.

The paper "A Self-Correcting Inking Strategy for Cantilever Arrays Addressed by an Inkjet Printer and Used for Dip-Pen Nanolithography," by Wang et al., *Small,* 2008, published on-line Jul. 24, 2008, is incorporated by reference in its entirety The entire disclosures of priority U.S. Provisional Ser. Nos. 61/055,028 filed May 21, 2008; 61/047,630 filed Apr. 24, 2008; and 60/954,732 filed Aug. 8, 2007 are hereby incorporated by reference in their entireties, including figures.

DPN printing, including instrumentation, materials, and methods, is generally known in the art. For practice of the various embodiments described herein, lithography, microlithography, and nanolithography instruments, pen arrays, active pens, passive pens, inks, patterning compounds, kits, ink delivery, software, and accessories for direct-write printing and patterning can be obtained from NanoInk, Inc., Chicago, Ill. Softwares include INKCAD and NSCRIPTOR softwares (NanoInk, Chicago, Ill.), providing user interfaces for lithography design and control. E-Chamber can be used for environmental control. Dip Pen Nanolithography™ and DPN™ are trademarks of NanoInk, Inc.

The following patents and co-pending applications related to direct-write printing with use of cantilevers, tips, and patterning compounds are hereby incorporated by reference in their entirety and can be used in the practice of the various embodiments described herein, including inks, patterning compounds, software, ink delivery devices, and the like:

U.S. Pat. No. 6,635,311 to Mirkin et al., which describes fundamental aspects of DPN printing including inks, tips, substrates, and other instrumentation parameters and patterning methods;

U.S. Pat. No. 6,827,979 to Mirkin et al., which further describes fundamental aspects of DPN printing including software control, etching procedures, nanoplotters, and complex and combinatorial array formation.

U.S. patent publication number 2002/0122873 A1 published Sep. 5, 2002 ("Nanolithography Methods and Products Produced Therefor and Produced Thereby"), which describes aperture embodiments and driving force embodiments of DPN printing.

U.S. regular patent application Ser. No. 10/366,717 to Eby et al., filed Feb. 14, 2003 ("Methods and Apparatus for Aligning Patterns on a Substrate"), which describes alignment methods for DPN printing (published Oct. 2, 2003 as 2003/0185967).

U.S. regular patent application Ser. No. 10/375,060 to Dupeyrat et al., filed Feb. 28, 2003 ("Nanolithographic Calibration Methods"), which describes calibration methods for DPN printing.

U.S. Patent Publication 2003/0068446, published Apr. 10, 2003 to Mirkin et al. ("Protein and Peptide Nanoarrays"), which describes nanoarrays of proteins and peptides;

U.S. Regular patent application Ser. No. 10/307,515 filed Dec. 2, 2002 to Mirkin et al. ("Direct-Write Nanolithographic Deposition of Nucleic Acids from Nanoscopic Tips"), which describes nucleic acid patterning (PCT/US2002/038252 published Jun. 12, 2003).

U.S. Regular patent application Ser. No. 10/320,721 filed Dec. 17, 2002 to Mirkin et al. ("Patterning of Solid State Features by Direct-Write Nanolithographic Printing"), which describes reactive patterning and sol gel inks (now published Aug. 28, 2003 as 2003/0162004).

U.S. Pat. Nos. 6,642,129 and 6,867,443 to Liu et al. ("Parallel, Individually Addressable Probes for Nanolithography"), describing active pen arrays.

U.S. Patent Publication 2003/0007242, published Jan. 9, 2003 to Schwartz ("Enhanced Scanning Probe Microscope and Nanolithographic Methods Using Same").

U.S. Patent Publication 2003/0005755, published Jan. 9, 2003 to Schwartz ("Enhanced Scanning Probe Microscope").

U.S. patent application Ser. No. 10/637,641 filed Aug. 11, 2003, now published as 2004/0101469, describing catalyst nanostructures and carbon nanotube applications.

U.S. patent application Ser. No. 10/444,061 filed May 23, 2003, now published as 2004/0026681 published Feb. 12, 2004, and US patent publication 2004/0008330 published Jan. 15, 2004, describing printing of proteins and conducting polymers respectively.

U.S. patent application Ser. No. 10/647,430 filed Aug. 26, 2003, now U.S. Pat. No. 7,005,378, describing conductive materials as patterning compounds.

U.S. patent application Ser. No. 10/689,547 filed Oct. 21, 2003, now published as 2004/0175631 on Sep. 9, 2004, describing mask applications including photomask repair.

U.S. patent application Ser. No. 10/705,776 filed Nov. 12, 2003, now published as 2005/0035983 on Feb. 17, 2005, describing microfluidics and ink delivery.

U.S. patent application Ser. No. 10/788,414 filed Mar. 1, 2004, now published as 2005/0009206 on Jan. 13, 2005 describing printing of peptides and proteins.

U.S. patent application Ser. No. 10/893,543 filed Jul. 19, 2004, now published as 2005/0272885 on Dec. 8, 2005, describing ROMP methods and combinatorial arrays.

U.S. patent application Ser. No. 11/056,391 filed Feb. 14, 2005, now published as 2005/0255237 published on Nov. 17, 2005, describing stamp tip or polymer coated tip applications.

U.S. patent application Ser. No. 11/065,694 filed Feb. 25, 2005, now published as 2005/0235869 on Oct. 27, 2005, describing tipless cantilevers and flat panel display applications.

US Patent publication 2006/001,4001 published Jan. 19, 2006 describing etching of nanostructures made by DPN methods.

WO 2004/105046 to Liu & Mirkin published Dec. 2, 2004 describes scanning probes for contact printing US Patent Publication 2007/0129321 to Mirkin describing virus arrays.

See also two dimensional nanoarrays described in, for example, US Patent Publication 2008/0105042 to Mirkin et al., filed Mar. 23, 2007, which is hereby incorporated by reference in its entirety.

DPN methods are also described in Ginger et al., "The Evolution of Dip-Pen Nanolithography," *Angew. Chem. Int. Ed.* 43, 30-45 (2004), including description of high-throughput parallel methods.

Direct write methods, including DPN printing and pattern transfer methods, are described in for example *Direct-Write Technologies, Sensors, Electronics, and Integrated Power Sources,* Pique and Chrisey (Eds) (2002).

The direct-write nanolithography instruments and methods described herein are particularly of interest for use in preparing bioarrays, nanoarrays, and microarrays based on peptides, proteins, nucleic acids, DNA, RNA, viruses, biomolecules, and the like. See, for example, U.S. Pat. No.

6,787,313 for mass fabrication of chips and libraries; U.S. Pat. No. 5,443,791 for automated molecular biology laboratory with pipette tips; U.S. Pat. No. 5,981,733 for apparatus for the automated synthesis of molecular arrays in pharmaceutical applications. Combinatorial arrays can be prepared. See also, for example, U.S. Pat. Nos. 7,008,769; 6,573,369; and 6,998,228 to Henderson et al.

Scanning probe microscopy is reviewed for example in Bottomley, *Anal. Chem.* 70, 425R-475R (1998). Also, scanning probe microscopes are known in the art including probe exchange mechanisms as described in, for example, U.S. Pat. No. 5,705,814 (Digital Instruments).

Tips and Instrumentation

Instruments can be used which provide for patterning from one or more tips disposed on one or more cantilevers, including arrays of tips and cantilevers. The instrument can be for example an AFM instrument modified for dip pen nanolithography, or alternatively, a similar instrument adapted directly to do dip pen nanolithography. Instrument can be obtained for example from NanoInk (Skokie, Ill.) including for example an NSCRIPTOR™.

In some embodiments, the instrument comprises at least one z-axis piezoelectric sensor and at least three z-axis motors, both of which can be controlled and monitored by a software routine that allows a user to input positional information via a user interface. An example of the instruments is described in the U.S. provisional application 60/916,979 filed May 9, 2007 to Amro et al.

Instrumentation to execute patterning by transferring materials from tip to substrate surface are known in the art. See for example products from NanoInk, Inc. (Skokie, Ill.). See also for example U.S. Pat. Nos. 6,827,979; 6,642,129; 6,867,443; 7,008,769; 6,573,369; and 6,998,228. For example, the tip can be a nanoscopic tip. The tip for example can be a scanning probe microscope tip or an atomic force microscope tip. The tip can be a solid tip; or the tip can be a hollow tip or a fountain pen tip. The hollow tip can comprise an aperture and can delivery flow paths for delivering patterning compositions to the end of the tip. The tip can comprise, for example, an inorganic surface or an organic surface. Tips can be made from hard materials through, for example, microfabrication. Sharpening of tips can be carried out. In addition, elastomeric tips can be used including those made from siloxane materials.

After tip fabrication, the tip can be used as is, although the tip can be cleaned first when used as is. The tip can be also surface modified if desired after fabrication. For example, an organic coating can be added to an inorganic tip surface.

The tip can comprise a tip surface, including an inorganic tip surface, which has not been modified by organic material.

Tips can be made from materials known in the AFM art, including silicon nitride, silicon, and other hard materials.

The tip can be disposed on a cantilever, as known in the art, including at an end of a cantilever or near the end of a cantilever.

The tips can be if desired relatively long tips having for example a length of at least 5 microns, or at least 10 microns.

The tip can be part of an array of tips, so that a plurality of tips can be provided. For moving in the z-direction with respect to the surface, the tips can move together in a passive mode or can be moved individually in an active or actuated mode. Hence, in the depositing step, the tip can be passively used, or can be used as an actuated tip. The actuation mechanism can be for example thermal or electrostatic or piezoresistive. One-dimensional array of tips can be used; or two-dimensional array of tips can be used. In particular, arrays can be used which have large numbers of tips. See for example U.S. patent application Ser. No. 11/690,738 filed Mar. 23, 2007 to Mirkin et al., which is hereby incorporated by reference in its entirety including the Lenhart *Small* paper (Lenhart et al., *Small* 3, no. 1, 71-75 (2007)).

Instrumentation methods are known in the art to move tips, and tips disposed on cantilevers, in the x, y, and z-directions with respect to the surface.

Instrumentation can be adapted to allow for heating of tips. See for example US Patent Publication No. 2006/0242740 to Sheehan et al.

Substrate and Substrate Surface

A wide variety of substrates can be used which present surfaces for deposition. Substrates can be those used to prepare microarrays in the art. Substrates can be polymeric, glass, ceramic, composite, metal, semiconductor, oxides, silicon, and the like. The substrate can be monolithic, one piece, or can comprise layers disposed on each other. The substrate can comprise an inorganic or an organic surface coating. A monolayer, including self-assembled monolayer, coating can be used. The surface can be functionalized with organic functional groups or organic material. For example, the substrate can comprise an inorganic material surface modified with an organic material. Further, substrates need not be limited to inorganic materials. For example, a substrate can be a biomolecule.

The substrate surface can be adapted to covalently bond to or chemisorb to one or more components of the patterning composition. For example, the substrate surface can be an electrophilic surface. The substrate surface can be adapted to be reactive with functional groups in the patterning species. For example, amino groups in a protein can react with succinimide. Or a thiol group or compound can chemisorb to gold. For example, aldehyde-modified substrate can also be used as a reactive support for the immobilization of amine-modified or amine-containing biomolecules via imine formation. Once the encapsulated biomolecules are deposited onto the substrate from the ADM tip, the agarose gel matrix can be dried by the exposure to the air and removed by washing with MilliQ water.

If fluorescent detection is used, the substrate and patterning can be adapted to minimize or avoid quenching of the fluorescence.

Substrates can be pre-patterned as needed to provide boundaries for and designate spaces for the deposition zones.

Deposition

The tip and the substrate surface can be moved with respect to each other so that deposition of the patterning composition occurs and material is transferred from the tip to the surface to form a deposit. In some cases, a meniscus may be present to facilitate deposition. The tip is in position so that deposition can be controlled as desired.

In some cases, heat can be used to facilitate deposition. Tips and cantilevers supporting tips can be heated, or the environment around the deposition area can be heated. An environmental chamber can be used to control humidity, temperature, atmospheric gases, and other parameters. For example, the deposition can be carried out at a relative humidity sufficient, e.g., sufficiently high, to allow the deposition to occur. In some cases, higher relative humidity may activate or speed up deposition. The deposition can be carried out at a relative humidity of for example at least 30%, or at least 50%, or at least 70%.

If the carrier exhibits a gel-liquid crystal transition temperature, the deposition temperature can be above this temperature, e.g., 10° C. or more above the gel-liquid crystal transition temperature.

The deposition step can be carried out by contacting the tip with the surface, wherein the tip is held stationary in the xy plane with respect to the surface. Spots or dots can be made, or lines can be made. Alternatively, the deposition step can be carried out by contacting the tip with the surface, wherein the tip is not held stationary in the xy plane with respect to the surface, but rather the tip is moving.

The contact time during the spotting/depositing can vary between for example 7 and 10 seconds, resulting in features of, for example, about 10 nm to about one micron, or about 100 nm to about 10 microns, or about 15 nm to about 10 microns, or about 25 nm to about one micron, or about 200 to about 500 nm in diameter or line width. AFM probes that can be used can have a spring constant k ranging from for example about 0.3 to about 2 $N/m^2$.

If scanning probe instrumentation is used, such as AFM instrumentation, a variety of modes for use can be used including for example contact mode, noncontact mode, or tapping mode or intermittent contact mode.

After a short incubation period in which the gel forms, AFM tips may be immediately coated by directly dipping the tips into the gel-ink, by inkwells, or by placing a drop of the gel-ink on a solid substrate and lowering the tips into the gel by an AFM or other controlled mechanics. The sticky, viscous nature of the agarose gel-ink can allo for minimal to none tip Arrays One or two dimensional arrays of tips can be used, and can be adapted to be inked with ink jet printing. The arrays can comprise no cantilevers or a plurality of cantilevers, upon which the tips are disposed. In some embodiments, the cantilevers have at least a support on one end, and a tip on the other.

The 2D array of cantilevers are known in the art. In addition, for example, U.S. patent application Ser. No. 11/690,738 filed Mar. 27, 2007 to Mirkin et al., describes two dimensional arrays of cantilevers.

The two-dimensional array can be a series of rows and columns, providing length and width, preferably substantially perpendicular to each other. The arrays can comprise a first dimension and a second dimension. The two-dimensional array can be a series of one dimensional arrays disposed next to each other to build the second dimension. The two dimensions can be perpendicular. The cantilevers can comprise a free end and a bound end. The cantilevers can comprise tips at or near the free end, distal from the bound end. The cantilevers of one row can point in the same direction as the cantilevers on the next row, or the cantilevers of one row can point in the opposite direction as the cantilevers on the next row.

The two-dimensional arrays can be fabricated into a larger instrumental device by combining two parts, each part having a surface which is patterned in two dimensions and adapted to be mated with each other in the two dimensions. One part can comprise a support structure, without cantilevers, whereas the other part can comprise the cantilevers.

One important variable is the fraction or percentage of the cantilevers in the array which can actually function for the intended purposes. In some cases, some cantilevers can be imperfectly formed, or can be otherwise damaged after formation. A cantilever yield reflects this percentage of usable cantilevers. Preferably, the array is characterized by a cantilever yield of at least 75%, or at least 80%, or at least 90%, or at least 95%, or more preferably, at least about 98%, or more preferably at least 99%. In characterizing the cantilever yield, cantilevers at the ends of rows may be neglected which are damaged by processing of edges compared to internal cantilevers. For example, the central 75% can be measured. In many cases, the fabrication will be better done in the middle rather than the edge as edge effects are known in wafer fabrication. Defect density can increase in some cases as one moves from the center to the edge, or in other cases as one moves from edge to center. One can remove parts which have too high defect density and use remaining parts.

The array can be adapted to prevent substantial contact of non-tip components of the array when the tips are brought into contact with a substantially planar surface. For example, the cantilever arms should not contact the surface and can be accordingly adapted such as by, for example, bending. The tips can be adapted for this as well including, for example, long or tall tips. Factors which can be useful to achieve this result include use of long or tall tips, bending of the cantilever arms, tip leveling, row leveling, and leveling of the cantilevers in all dimensions. One or more combination of factors can be used.

The cantilever tips can be longer than usual in the art. For example, the tips can have an apex height relative to the cantilever of at least four microns on average, and if desired, the tips can have an apex height relative to the cantilever of at least seven microns on average. The term "apex" need not be defined narrowly to refer to only the very end of the tip; rather it can be referred to a portion of the tip spanning from the very end to a certain distance downward. For example, it can be from the very end to 1%, 5%, 10%, or even 20%, of axial length from the end to the bottom of the tip. In addition, tip apex height can be at least 10 microns, or at least 15 microns, or at least 20 microns. No particular upper limit exists and technology known in the art and improving can be used. This long length can help ensure that only tips are contacting the surface. Apex height can be taken as an average of many tip apex heights, and in general, apex height is engineered not to vary substantially from tip to tip.

In measuring parameters for the array, average measurements can be used. Average measurements can be obtained by methods known in the art including for example review of representative images or micrographs. The entire array does not need to be measured as that can be impractical.

Tipless cantilevers can be used in some embodiments, although not a preferred embodiment.

In addition, the cantilevers can be bent including bent towards the surface to be patterned. Methods known in the art can be used to induce bending. The cantilevers can be bent at an angle away from the base and the support. The cantilevers can comprise multiple layers adapted for bending of cantilevers. For example, differential thermal expansion or cantilever bimorph can be used to bend the cantilevers. Cantilever bending can be induced by using at least two different materials. Alternatively, the same materials can be used but with different stresses to provide cantilever bending. Another method is depositing on the cantilever comprising one material a second layer of the same material but with an intrinsic stress gradient. Alternatively, the surface of the cantilever can be oxidized. The cantilevers can be bent at an angle for example of at least 5° from their base, or at least 10° from their base, or at an angle of at least 15° from their base. Methods known in the art can be used to measure this including the methods demonstrated in the working examples. Average value for angle can be used. The cantilevers can be bent on average about 10 microns to about 50 microns, or about 15 microns to about 40 microns. This distance of bending can be measured by methods known in the art including the methods demonstrated in the working examples. Average distance can be used. The bending can result in greater tolerance to substrate roughness and morphology and tip misalignment within the array so that for example a misalignment of about ±20 microns or less or about ±10 microns or less can be compensated.

To facilitate bending, the cantilevers can comprise multiple layers such as two principle layers and optional adhesion layers and can be for example bimorph cantilevers. The cantilevers can be coated with metal or metal oxide on the tip side of the cantilever. The metal is not particularly limited as long as the metal or metal oxide is useful in helping to bend the cantilevers with heat. For example, the metal can be a noble metal such as gold.

In preferred embodiments, the array can be adapted so that the cantilevers are both bent toward the surface and also comprise tips which are longer than normal compared to tips used merely for imaging.

The tips can be fabricated and sharpened before use and can have an average radius of curvature of, for example, less than 100 nm. The average radius of curvature can be, for example, 10 nm to 100 nm, or 20 nm to 100 nm, or 30 nm to 90 nm. The shape of the tip can be varied including for example pyramidal, conical, wedge, and boxed. The tips can be hollow tips or contain an aperture including hollow tips and aperture tips formed through microfabrication with microfluidic channels passing to end of tip. Fluid materials can be stored at the end of the tips or flow through the tips.

The tip geometry can be varied and can be for example a solid tip or a hollow tip. WO 2005/115630 (PCT/US2005/014899) to Henderson et al. describes tip geometries for depositing materials onto surfaces which can be used herein.

The two dimensional array can be characterized by a tip spacing in each of the two dimensions (e.g., length dimension and width dimension). Tip spacing can be taken, for example, from the method of manufacturing the tip arrays or directly observed from the manufactured array. Tip spacing can be engineered to provide high density of tips and cantilevers. For example, tip density can be at least 10,000 per square inch, or at least 40,000 per square inch, or at least 70,000 per square inch, or at least 100,000 per square inch, or at least 250,000 per square inch, or at least 340,000 per square inch, or at least 500,000 per square inch. The array can be characterized by a tip spacing of less than 300 microns in a first dimension of the two dimensional array and less than 300 microns in a second dimension of the two dimensional array. To achieve even higher density, the tip spacing can be, for example, less than about 200 microns in one dimension and less than about 100 microns, or less than about 50 microns, in another dimension. Alternatively, the tip spacing can be for example less than 100 microns in one dimension and a less than 25 microns in a second direction. The array can be characterized by a tip spacing of 100 microns or less in at least one dimension of the two dimensional array. In one embodiment, tip spacing can be about 70 microns to about 110 microns, such as 90 microns, in one dimension, and about 20 microns to about 100 microns, such as 90 microns, in the second dimension. There is no particular lower limit on tip spacing as fabrication methods will allow more dense tip spacing over time. In some embodiments where different inks and a 2D array is used, the tip spacing is controlled to prevent undesirable ink spreading and cross-contamination of different ink. Examples of lower limits include 1 micron, or 5 microns, or 10 microns so for example tip spacings can be one micron to 300 microns, or one micron to 100 micron.

The number of cantilevers on the two dimensional array is not particularly limited but can be at least about three, at least about five, at least about 250, or at least about 1,000, or at least about 10,000, or at least about 50,000, or at least about 55,000, or at least about 100,000, or about 25,000 to about 75,000. The number can be increased to the amount allowed for a particular instrument and space constraints for patterning. A suitable balance can be achieved for a particular application weighing for example factors such as ease of fabrication, quality, and the particular density needs.

The tips can be engineered to have consistent spacing for touching the surface consistently. For example, each of the tips can be characterized by a distance D spanning the tip end to the support, and the tip array is characterized by an average distance D' of the tip end to the support, and for at least 90% of the tips, D is within 50 microns of D'. In another embodiment, for at least 90% of the tips, D is within 10 microns of D'. The distance between the tip ends and the support can be for example about 10 microns to about 50 microns. This distance can comprise for example the additive combination of base row height, the distance of bending, and the tip height.

Cantilever force constant is not particularly limited. For example, the cantilevers can have an average force constant of about 0.001 N/m to about 10 N/m, or alternatively, an average force constant of about 0.05 N/m to about 1 N/m, or alternatively an average force constant of about 0.1 N/m to about 1 N/m, or about 0.1 N/m to about 0.6 N/m.

The cantilevers can be engineered so they are not adapted for feedback including force feedback. Alternatively, at least one cantilever can be adapted for feedback including force feedback. Or substantially all of the cantilevers can be adapted for feedback including force feedback. For example, over 90%, or over 95%, or over 99% of the cantilevers can be adapted for feedback including force feedback.

The cantilevers can be made from materials used in AFM probes including for example silicon, polycrystalline silicon, silicon nitride, or silicon rich nitride. The cantilevers can have a length, width, and height or thickness. The length can be for example about 10 microns to about 80 microns, or about 25 microns to about 65 microns. The width can be for example 5 microns to about 25 microns, or about 10 microns to about 20 microns. Thickness can be for example about 100 nm to about 700 nm, or about 250 nm to about 550 nm. Tipless cantilevers can be used in the arrays, the methods of making arrays, and the methods of using arrays.

Arrays can be passive or active arrays adapted for passive pen or active pen use, respectively. Control of each tip can be carried out by piezoelectric, capactive, electrostatic, or thermoelectric actuation, for example.

The arrays can be adapted for integration of tip coating and ink delivery. For example, microfluidics can be used to control inking and coating of the tips. Tips can be dipped into devices or ink can be delivered directly through internal regions of the tip for hollow tip embodiments.

An important embodiment is that the cantilevers can be bonded to the support structure via gold thermocompression bonding. Important factors can be an inherent force independence of the lithographic process based on cantilever tip deposition and use of low k flexible cantilevers including silicon nitride cantilevers.

Patterning Composition

Patterning compositions can be formulated and adapted for transfer and deposition from the tip to a substrate surface, and also adapted for ink jet printing. The compositions can comprise two or more components including one or more polysaccharides, one or more patterning species, and one or more chemical additives. The patterning composition can be formulated to exclude components and amounts of components that would interfere with the deposition process, wherein the patterning composition comprises the ingredients needed to carry out a successful result. Patterning compositions can be dried, partially or fully, on the tip before the deposition step.

The patterning composition can be in the form of an ink. It can comprise one or more patterning species. The patterning species can be molecular or particulate or colloid. It can be synthetic or natural. It can be polymeric, oligomeric, or non-polymeric. It can be a small molecule. Biomolecular applications are particular of note. For example, the patterning species can be a biomolecule (wherein water is not a biomolecule). The patterning species can be a biopolymer. The patterning species can comprise polymerized or repeating units of nucleic acid or amino acid units. Patterning species can be for example oligonucleotides, DNA, RNA, protein, peptide, sugar, carbohydrate, and the like. The patterning species can be used such that it is not adapted synthetically for interaction with a substrate surface. For example, it can be a natural species such as for example a natural protein. Alternatively, the patterning species can be used such that it is adapted synthetically for interaction with a substrate surface. For example, an end group can be functionalized to bond to the surface. This can be represented by, for example, R—X or R—(X)$_n$, wherein R is a patterning species that has been functionalized with group X, and n is the number of groups X, which can be for example 1-10, or 1-5, or 1-3.

Non-biological compounds which can serve as patterning species include for example particulate materials, nanostructured materials, organic compounds, inorganic compounds, polymers, synthetic polymers, compounds which chemisorb to metals (e.g., gold) such as thiols and sulfides, and the like.

In one embodiment, the patterning composition can comprise one or more lipids, and lipids are generally known in the art. See for example, Bohinski, *Modern Concepts in Biochemistry*, 4$^{th}$ Ed., Chapter 8, "Lipids and Biomembranes." For example, lipids can be simple lipids, compound lipids, or derived lipids. Simple lipids can be for example acylglycerols or waxes. Compound lipids can be for example phsphoacylglycerols, sphingomyelins, cerebrosides, or gangliosides. Derived lipids can be for example steroids, carotenoids, or lipid vitamins.

For lipids known in the art, see also, for example, chapter 33, as well as the entire textbook of *Organic Chemistry* 6$^{th}$ ed., Morrison and Boyd, Prentice hall, Englewood cliffs, N.J. 1992; chapter 2, as well as the entire textbook of *Molecular biology of the cell* 3$^{rd}$ ed., Alberts et al., Garland publishing, New York, N.Y., 1994; and chapter 21, as well as the entire textbook of *Organic Chemistry* 3$^{rd}$ ed., Loudon, the Benjamin/Cummings publishing co., Redwood City Calif., 1995.

Lipids can be used which are natural or synthetic. The lipid can be able to form liposomes in aqueous solution, either on its own or in combination with other lipids.

Lipids can be compounds comprising long hydrocarbon chains which can result in them being insoluble in water but soluble in nonpolar organic solvents.

Additional examples of lipids include fats, oils, steroid and waxes.

Glycerides are one type of lipids which are formed from glycerol and fatty acids. Glycerol comprises three hydroxyl groups which upon esterification with one, two or three fatty acids forms monoglycerides, diglycerides and triglycerides respectively. If one of the fatty acids is replaced with a sugar or a phosphate the resulting compound is a glycolipid or a phospholipid respectively. The fatty acids can be unsaturated, saturated, monounsaturated or polyunsaturated. Examples of unsaturated fatty acids includes, oleic, linoleic, linolenic and arachidonic acid. Examples of saturated fatty acids includes, myristic, palmitic and stearic acids. Further, the fatty acids may adopt a cis or trans configuration. The length of the fatty acid chain may vary. For example, the fatty acid hydrocarbon chain may comprise more than 3 carbon atoms, between 3-18 atoms or between 12-20 carbon atoms. The chain may or may not be branched. In one embodiment, the lipid compound comprises a phosphate group. In another embodiment, the lipid compound comprises a sugar group. In one embodiment, the lipid compound comprises one, two or three fatty acids. In a further embodiment, the lipid compound comprises at least one fatty acid which is saturated, monounsaturated or polyunsaturated. The lipid can comprise two fatty acids. At least one fatty acid can be monounsaturated. Both fatty acids can be monounsaturated. The fatty acid may be cis or trans. In one embodiment, at least one fatty acid comprises at least 3 carbon atoms. In another embodiment, at least one fatty acid comprises between 3 and 18 carbon atoms, including all integers in between. In another embodiment, at least one fatty acid comprises between 12 and 20 carbon atoms including all integers in between.

Lipid can be a phospholipid or a phospholipid derivative. The lipid can exhibit a gel-liquid crystal transition temperature. The molecular weight of the lipid can be for example 250 to about 2,000, or about 500 to about 1,500, or about 500 to about 1,000. Non limiting examples include phophacholine, phosphoglycerol, phosphatidic acid, phosphoserine, PEG phospholipid, and the like. The lipid can serve as a carrier. In one embodiment, the lipid is 1,2-dioleoyl-sn-glycero-3 pphosphocholine ("DOPC"). Other examples include POPC and DMPC. See for example Lenhart et al., *Small*, 2007, 3, no. 1, 71-75 for lipids which can be patterned.

In one embodiment, each of the dye-labeled lipids was diluted (1 wt %) in a carrier lipid, 1,2-Dioleoyl-sn-Glycero-3-Phosphocholine (DOPC). The use of DOPC as a carrier for multiplexed DPN can be important for several reasons. First, it allows one to make the transport properties of different dye-labeled lipid inks uniform. Second, it is possible to incorporate up to ~25 wt % of certain functional lipids (such as biotinylated or nickel chelating lipids) with DOPC. Third, being a major structural and functional component of biological membranes, phospholipids are well studied and compatible with many biological molecules.[18]

In another embodiment, the patterning composition can comprise proteinaceous material and proteins and peptides. Proteinaceous materials include for example antibodies, enzymes, and the like.

In the peptide and protein embodiments, the nanoarrays can be prepared comprising various kinds of chemical structures comprising peptide bonds. These include peptides, proteins, oligopeptides, and polypeptides, be they simple or complex. The peptide unit can be in combination with non-peptide units. The protein or peptide can contain a single polypeptide chain or multiple polypeptide chains. Higher molecular weight peptides are preferred in general although lower molecular weight peptides including oligopeptides can be used. The number of peptide bonds in the peptide can be, for example, at least three, ten or less, at least 100, about 100 to about 300, or at least 500.

Proteins are particularly preferred. The protein can be simple or conjugated. Examples of conjugated proteins include, but are not limited to, nucleoproteins, lipoproteins, phosphoproteins, metalloproteins and glycoproteins.

Proteins can be functional when they coexist in a complex with other proteins, polypeptides or peptides. The protein can be a virus, which can be complexes of proteins and nucleic acids, be they of the DNA or RNA types. The protein can be a shell to larger structures such as spheres or rod structures.

Proteins can be globular or fibrous in conformation. The latter are generally tough materials that are typically insoluble in water. They can comprise a polypeptide chain or chains arranged in parallel as in, for example, a fiber.

Examples include collagen and elastin. Globular proteins are polypeptides that are tightly folded into spherical or globular shapes and are mostly soluble in aqueous systems. Many enzymes, for example, are globular proteins, as are antibodies, some hormones and transport proteins, such as serum albumin and hemoglobin.

Proteins can be used which have both fibrous and globular properties, like myosin and fibrinogen, which are tough, rod-like structures but are soluble. The proteins can possess more than one polypeptide chain, and can be oligomeric proteins, their individual components being called protomers. The oligomeric proteins usually contain an even number of polypeptide chains, not normally covalently linked to one another. Hemoglobin is an example of an oligomeric protein.

Types of proteins that can be incorporated include, but are not limited to, enzymes, storage proteins, transport proteins, contractile proteins, protective proteins, toxins, hormones, and structural proteins.

Examples of enzymes include, but are not limited to ribonucleases, cytochrome c, lysozymes, proteases, kinases, polymerases, exonucleases, and endonucleases. Enzymes and their binding mechanisms are disclosed, for example, in *Enzyme Structure and Mechanism*, $2^{nd}$ Ed., by Alan Fersht, 1977, including in Chapter 15 the following enzyme types: dehydrogenases, proteases, ribonucleases, staphyloccal nucleases, lysozymes, carbonic anhydrases, and triosephosphate isomerase.

Examples of storage proteins include, but are not limited to ovalbumin, casein, ferritin, gliadin, and zein.

Examples of transport proteins include, but are not limited to hemoglobin, hemocyanin, myoglobin, serum albumin, β1-lipoprotein, iron-binding globulin, and ceruloplasmin.

Examples of contractile proteins include, but are not limited to myosin, actin, dynein.

Examples of protective proteins include, but are not limited to antibodies, complement proteins, fibrinogen, and thrombin.

Examples of toxins include, but are not limited to, *Clostridium botulinum* toxin, diptheria toxin, cholera toxin proteins, Alexa Fluor 594 modified cholera toxin proteins, snake venoms, and ricin.

Examples of hormones include, but are not limited to, insulin, adrenocorticotrophic hormone and insulin-like growth hormone, and growth hormone.

Examples of structural proteins include, but are not limited to, viral-coat proteins, glycoproteins, membrane-structure proteins, α-keratin, sclerotin, fibroin, collagen, elastin, and mucoproteins.

Natural or synthetic peptides and proteins can be used. Proteins that can be used, for example, are prepared by recombinant methods.

Examples of preferred proteins include immunoglobulins, IgG (rabbit, human, mouse, and the like), Protein A/G, fibrinogen, fibronectin, lysozymes, streptavidin, avdin, ferritin, lectin (Con. A), and BSA. Rabbit IgG and rabbit anti-IgG, bound in sandwhich configuration to IgG are useful examples.

Spliceosomes and ribozomes and the like can be used.

A wide variety of proteins are known to those of skill in the art and can be used. See, for instance, Chapter 3, *"Proteins and their Biological Functions: A Survey,"* at pages 55-66 of BIOCHEMISTRY by A. L. Lehninger, 1970, which is incorporated herein by reference.

Additional proteins are described below in the working examples, including labeled proteins and fluorescently labeled proteins. Proteins can include cholera toxin subunit B and trypsin inhibitor.

Other embodiments include various nucleic acids. For example, the nucleic acid can be synthetically made, modified to include, for example, functional groups tailored for chemisorption or covalent bonding to the substrate, as well as naturally occurring. It can be of low, medium, or high molecular weight, oligomeric or polymeric. It can be single-, double-, or even triple-stranded. The nucleic acid can be based on deoxyribonucleic acid (DNA), ribonucleic acid (RNA), or combinations thereof. The structure of nucleic acids is generally described in, for example, Calladine and Drew, *Understanding DNA, The Molecule and How it Works,* 2$^{nd}$ Ed., 1997.

General types of nucleic acid that can be patterned include, for example, DNA, RNA, PNA, CNA, RNA, HNA, p-RNA, oligonucleotides, oligonucleotides of DNA, oligonucleotides of RNA, primers, A-DNA, B-DNA, Z-DNA, polynucleotides of DNA, polynucleotides of RNA, T-junctions of nucleic acids, domains of non-nucleic acid polymer-nucleic acid block copolymers, and combinations thereof. Additional general types of nucleic acids include, for example, viral RNA or DNA, a gene associated with a disease, bacterial DNA, fungal DNA, nucleic acid from a biological source, nucleic acid which is a product of a polymerase chain reaction amplification, nucleic acid contacted with nanoparticles, and nucleic acid double-stranded and hybridized with the oligonucleotides on the nanoparticles resulting in the production of a triple-stranded complex.

In general, the nucleic acid can be any of a group of organic substances found in cells and viruses that play a central role in the storage and replication of hereditary information and in the expression of this information through protein synthesis. Purines, pyrimidines, carbohydrates, and phosphoric acid generally characterize the fundamental organic substances of a nucleic acid. Purines and pyrimidines are nucleotides, a nucleoside in which the primary hydroxy group of either 2-deoxy-D-ribose or of D-ribose is esterified by orthophosphoric acid. A nucleoside is a compound in which a purine or pyrimidine base is bound via a N-atom to C-1 replacing the hydroxy group of either 2-deoxy-D-ribose or of D-ribose, but without any phosphate groups. The common nucleosides in biological systems are adenosine, guanosine, cytidine, and uridine (which contain ribose) and deoxyadenosine, deoxyguanosine, deoxycytidine and thymidine (which contain deoxyribose). Thus, a purine base may be an adenine nucleotide or a guanine nucleotide. A pyrimidine base may be thymine nucleotide, a cytosine nucleotide, or a uracil nucleotide.

The sequence of a nucleic acid may be random or specific so as to encode a desired amino acid structure. For instance, a group of three nucleotides may comprise a codon. One codon comprises an amino acid. The coding region of a nucleic acid comprises codons.

The nucleic acid can exist freely or can be bound to peptides or proteins to form nucleoproteins in discreet bundles or structured forms such as, for example, chromosomes. A nucleic acid also can exist in single-stranded or double-stranded forms. A nucleic acid may also be linear, circular, or supercoiled. Nucleic acid may be isolated directly from a cell or organelle. A plasmid or cloning vector are also examples of nucleic acids.

The nucleic acid can be made up of nucleotides, each containing a carbohydrate sugar (deoxyribose), a phosphate group, and mixtures of nitrogenous purine- and pyrimidine-bases. The sugar may be of a cyclic or acyclic form. DNA comprises only thymine and cytosine pyrimidines and no uracil. DNA may be isolated from a cell as genomic, nuclear, or mitochondrial DNA, or made synthetically (i.e., by chemical processes).

A gene present in a cell typically comprises genomic DNA made up of exonic and intronic stretches of DNA. The exonic stretches comprises nucleotides that comprise codons that encode amino acids, whereas the intronic stretches of DNA comprise nucleotides that likely do not comprise codons that encode amino acids. The nucleotide sequence of purines and pyrimidines determine the sequences of amino acids in the polypeptide chain of the protein specified by that gene.

DNA may also be isolated as complementary or copy DNA (cDNA) synthesized from an RNA template by the action of RNA-dependent DNA polymerase. For example, the cDNA can be about 100-800mer strands from PCR amplification. If the RNA template has been processed to remove introns, the cDNA will not be identical to the gene from which the RNA was transcribed. Thus, cDNA may comprise a stretch of nucleotides that are largely exonic in nature.

When in double-stranded form, the two DNA strands form a double helix. In this helix, each nucleotide in one strand is hydrogen bonded to a specific nucleotide on the other strand. Thus, in DNA, adenine bonds with thymine and guanine bonds with cytosine. The ability of nucleotides present in each strand to bind to each other determines that the strands will be complementary, e.g., that for every adenine on one strand there will be a thymine on the other strand.

RNA can be generally similar to DNA, but contains the sugar ribose instead of deoxyribose and the base uracil instead of thymine. RNA can be single-stranded or double-stranded and is transcribed from a cell's DNA. An RNA molecule may form a hairpin loop or other double-stranded structures. RNA may be template RNA, messenger RNA (mRNA), total RNA, or transfer RNA (tRNA). polysome. RNA-DNA hybrid molecules can be deposited according to the present invention. Furthermore, protein-nucleic acids, or "peptide nucleic acids" ("PNA") also may be used.

The binding properties exhibited between complementary nucleotides can make nucleic acids useful as probes that can bind to other nucleic acids. Nucleic acids can be labelled and used as probes. By any one of a number of standard labelling techniques, nucleic acid probes can be used to detect, by hybridization, another nucleic acid. The hybridization can be visualized or detected if the label is, for example, a fluorescent, radioactive, or enzymatic label. Thus, a nucleic acid of the present invention also can be labelled, or modified so as to comprise a detectable entity, like a fluorescent marker or tag, a gold particle, streptavidin, digoxigenin, a magnetic bead, or other markers known to the skilled artisan. See, for example, U.S. Pat. No. 4,626,501 ("Labeled DNA") to Landes, which is hereby incorporated by reference in its entirety.

Nucleotides and nucleic acids also can be modified so that it is protected against nucleic acid degradation. For instance, a nucleic acid may be encapsulated within a liposome.

Alternatively, a thiol group may be incorporated into a polynucleotide, such as into an RNA or DNA molecule, by replacing the phosphorous group of the nucleotide. When so incorporated into the "backbone" of a nucleic acid, a thiol can prevent cleavage of the DNA at that site and, thus, improve the stability of the nucleic acid molecule.

U.S. Pat. No. 5,965,721 to Cook et al. is also incorporated by reference in its entirety, disclosing oligonucleotides, which can be patterned and can have improved nuclease resistance and improved cellular uptake.

Thus, the bioavailability of a nucleic acid treatment in vivo may be improved by modifying the nucleic acid as described. For instance, a modified nucleic acid formulation may have an increased half-life and/or be retained in plasma for longer periods of time than non-modified nucleic acids. A formulation of nucleic acid and polyethylene glycol, for instance, may also increase the half-life of the nucleic acid in vivo, as could any known slow-release nucleic acid formulation. Thus, modifying a nucleic acid may increase the effectiveness of the nucleic acid in vivo and/or its bioavailability.

The size of a nucleic acid can range considerably, from the size of a few nucleotides, to an oligonucleotide, or probe, to a polynucleotide, gene, chromosome fragment to entire chromosomes and genomes. For instance, a single- or double-stranded nucleic acid may be at least 10-, 20-, 30-, 40-, 50-, 60-, 70-, 80-, 90, or 100-nucleotides or base pairs (bp) in length. Larger still, a nucleic acid may be at least 0.2 kb, 0.3 kb, 0.4 kb, 0.5 kb, 0.6 kb, 0.7 kb, 0.8 kb, 0.9 kb, or 1.0 kb in size. Indeed, a nucleic acid for use in the present invention can be at least 1 kb, 2 kb, 3 kb, 4 kb, 5 kb, 6 kb, 7 kb, 8 kb, 9 kb, or 10 kb or larger in size. One preferred size range is 1-2 kb. The nucleic acid can be a chain of varying length of nucleotides and are typically called polynucleotides or oligonucleotides. An oligonucleotide is an oligomer generally resulting from a linear sequences of nucleotides. The oligonucleotide can comprise, for example, about 2 to about 100, about 2 to about 20, about 10 to about 90, or about 15 to about 35 nucleotides. In oligonucleotide arrays, about 25-mer oligonucleotides can be used. Another particular range is about 60- to about 80-mers, which are relatively long oligonucleotides.

Microarray methods, including selection of nucleic acid, probing, labeling, and detection, are described in U.S. Pat. Nos. 6,379,932 and 6,410,231 (Incyte Genomics) and can be used. These patents are incorporated by reference in their entirety. Although these references mention dip pen nanolithographic methods, they do not suggest how or provide guidance on how dip pen nanolithographic methods can be used to make improved nanoarrays as described herein.

A compound comprising a single nucleotide can also be used as ink. Mixtures of nucleic acids can be used, and different spots on an array can comprise different nucleic acids.

A nucleic acid for deposition may be formulated or mixed with other elements prior to, or after direct write deposition onto a substrate surface. Thus, an "ink" of the present invention may comprise other chemicals, compounds, or compositions for deposition onto a substrate surface in addition to a desired nucleic acid sample. Solvent and salt can be used to apply the nucleic acid to the tips. Surfactants can also be used. For instance, proteins, polypeptides, and peptides may be deposited along with a desired nucleic acid onto a substrate surface.

Nucleic acid arrays, and the types of nucleic acids used therein, are described for example in *A Primer of Genome Science*, G. Gibson and S. Muse, 2002, Chapters 3-4 (pages 123-181), which is hereby incorporated by reference. This reference, for example, describes both cDNA microarrays and oligonucleotide arrays, labeling, hybridization, and statistical analysis. cDNA arrays can be used for monitoring the relative levels of expression of thousands of genes simultaneously. PCR-amplified cDNA fragments (ESTs) can be spotted and probed against fluorescently or radioactively labeled cDNA. The intensity of the signal observed can be assumed to be in proportion to the amount of transcript present in the RNA population being studied. Differences in intensity reflect differences in transcript level between treatments. Statistical and bioinformatic analyses can then be performed, usually with the goal of generating hypotheses that may be tested with established molecular biological approaches. Current cDNA microarrays, however, can have an upper limit of 15,000 elements and are unable to represent the complete set of genes present in higher eukaryotic genomes. The advantages and disadvantages of oligonucleotide versus cDNA microarrays are described in the aforementioned *A Primer of Genome Science* and can be used in constructing nucleic acid nanoarrays as described herein.

Oligonucleotides are also described in the working examples hereinbelow including labeled oligonucleotides and fluorolabeled oligonucleotides.

Ink Jet Printing Inking

Ink jet printing is generally known in the art. A description of ink jet printing can be found in for example Madou, *Fundamentals of Microfabrication*, Chapter 3, CRC Press LLC (2002). Direct write methods, including ink jet printing, are described in for example *Direct-Write Technologies, Sensors, Electronics, and Integrated Power Sources*, Pique and Chrisey (Eds) (2002) including chapter 7 including continuous mode ink jet printing and demand mode (including drop-on-demand) ink jet printing. See also U.S. Pat. No. 7,034,854 for ink jet printing descriptions including fluid dispensing nozzles, as well as descriptions for ink wells. The ink dispensing system may be comprised in whole or in part of one or more micromechanical MEMS devices, incorporating nozzles, fluidic channels, pumps, and if required control electronics.

Ink jet printing can be used to deposit a patterning composition onto a tip. It can be used with one or more nozzles. The nozzle can have any diameter, depending upon the type of patterning composition to be used. The diameter can also be for example between 50 microns and 200 microns. For example, in one embodiment, the nozzle is a remote piezo-electric-controlled nozzle, which has a diameter of about 85 microns.

Figure 12:
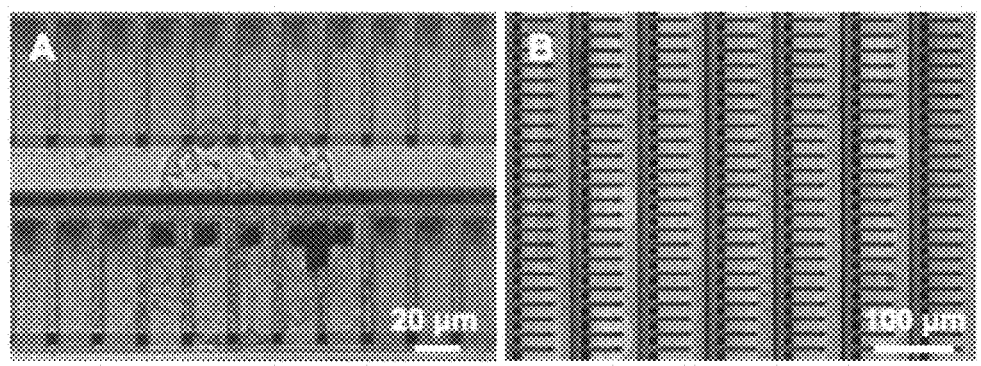
FIGS. 12A-12B illustrate (A) DOPC ink droplets caused the cantilevers to stick to the support due to capillary action. The optical microscopy image shows that inked tips are in the focal plane of the SiO$_2$ support. (B) This stiction problem was eliminated by functionalizing the back sides of the cantilevers and the SiO$_2$ support with octadecyltrichlorosilane (OTS).

Multiplexing is generally known in the art. For example, an illustration of the multiplexing scheme is provided in FIG. 1A-1B. Multiplexed inking of one or two dimensional arrays with patterning compositions can be possible. In particular, deposition can be carried out with simultaneously depositing at least two different ink compositions. The patterning composition can be of any type of ink. For example it can comprise various types of lipids, such as multiple fluorophore-labeled phospholipids. The array can include many pens, as described earlier. For example, a 2D array can comprise 55,000 pens. In one embodiment, the tips can be coated with a thin film of metal, such as gold. The tip can be further functionalized with different inorganic or organic compounds. For example, in one embodiment, the tips are functionalized with 1-mercaptoundecanol, whereas the remaining portion of the pen, including a portion of the tip and/or the cantilever and/or a portion of the support, comprising silicon nitride and silicon/$SiO_2$, can be passivated with 1-octadecyl-trichlorosilane (OTS). This chemical modification step can be important since it can overcome the capillary action-driven stiction of inked cantilevers to the silicon/$SiO_2$ support (see FIG. 12).

During multiplexing, a plurality of inks can be deposited from the tips simultaneously onto a substrate. The inks can be the same or different from one another. For example, the inks can be physically or chemically distinct.

The pens can be spaced apart with any suitable distance. For example, in an embodiment, the pens can be spaced less than about 250 microns apart, such as less than about 150 microns or such as less than about 100 microns, apart. In another embodiment where a 2D array of pens is used, the spacing can be for example less than about 200 microns×200 microns, such as less than about 100 microns×100 microns, such as 90 microns×90 microns. The spacing need not be a square. For example, the spacing can be 100 microns×80 microns or 50 microns×200 microns.

Figure 8:
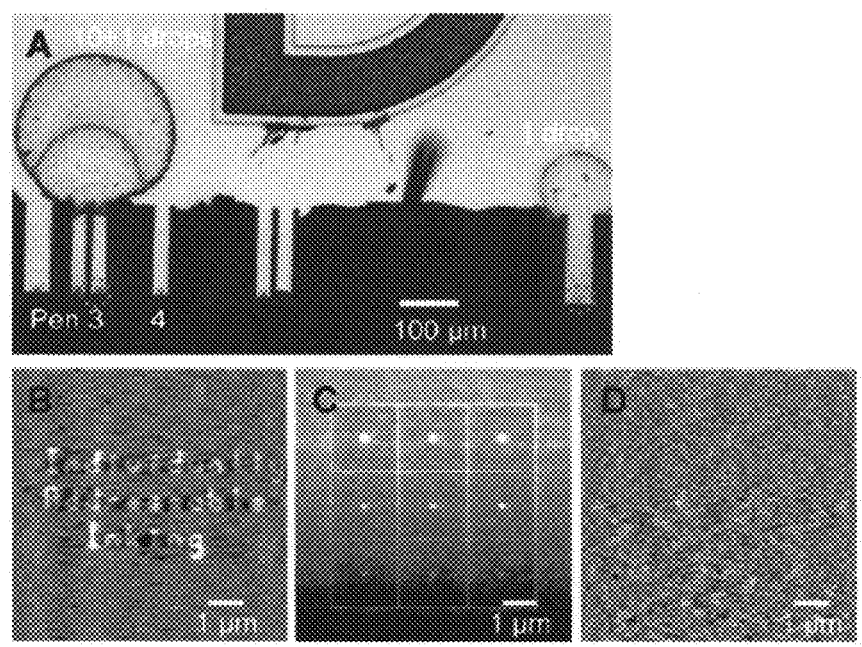
FIGS. 8A-8B illustrates inkjet printing of MHA (saturated solution in acetonitrile) on a custom pen array with different pen-to-pen spacings. (A) An optical microscopy image of an inked pen array. (B-C) Lateral force microscopy images showing that pen 3 (inked) was effective for DPN (ink diffusion rate of 0.015 μm$^2$ sec$^{-1}$). (D) Pen 4 (uninked control) did not produce patterns. DPN was carried out at a relative humidity of 49%.
Figure 9:
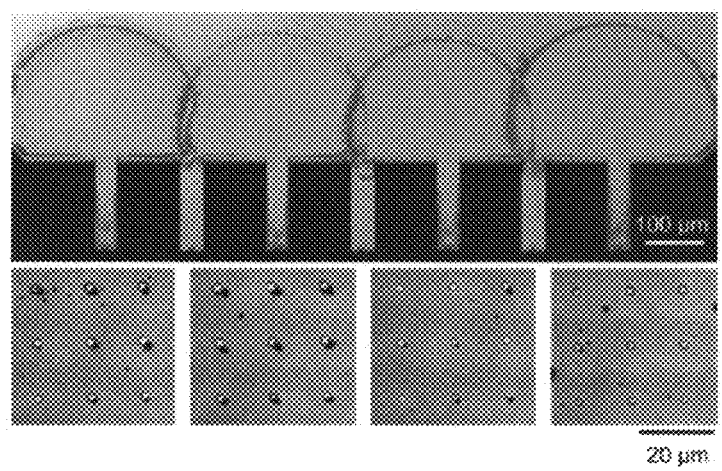
FIG. 9 shows pattern uniformity of inkjetted pen arrays. Two drops of an MHA-ethanol solution (10 mM, 320 pL/drop) were inkjetted on alternating pens. The DPN was carried out at a relative humidity of 40%, and the dwell time per dot is 360 seconds. The standard deviation of the gold patterns generated by pens in the same array is 4.4±1.4%, and increases to 4.8±0.7% when comparing three different pen arrays.
Figure 10:
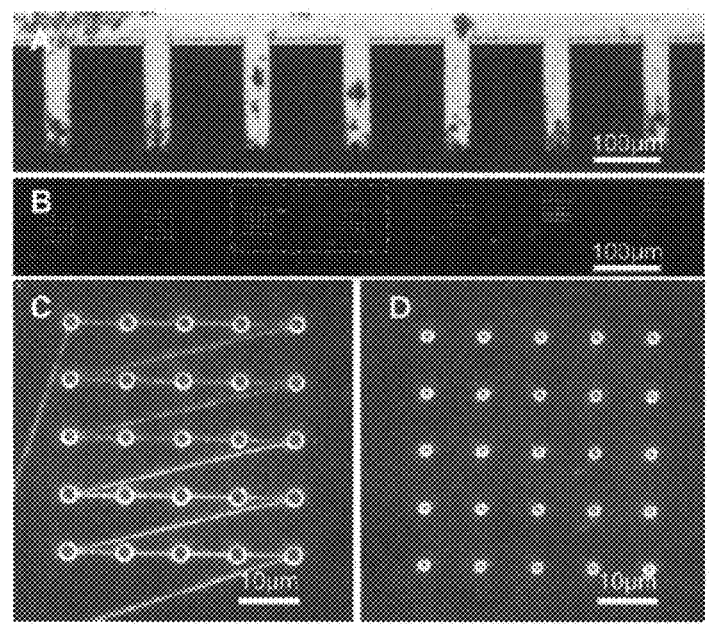
FIGS. 10A-10D provides pattern size variation of pen arrays inked by dip coating. (A) Optical microscopy image of dip-coated pen array. (B) Dark field microscopy image of raised gold features generated by the pen array in "A". (C-D) Higher magnification of patterns boxed in (B). The standard deviation of dots created by different pens in the same array was at least 9.9%. Both inks (2 mM MHA-ethanol solution and saturated MHA-acetonitrile solution) showed similar standard deviations. In this particular example, DPN was cried out at a relative humidity of 50%, and the dwell time for each dot was 30 seconds. Note that the lines in "C" connecting the dots are present because the pen was not completely removed from contact with the surface.

Generally, the inking process in prior art methods involves pens soaking in an ink solution for a few seconds, after which they are blown dry with $N_2$.[1, 23-25]. However, this process can introduce variability due to inhomogeneous solvent drying, which can depend on the duration and angle of nitrogen ($N_2$) blowing, as well as the manner of soaking. In one embodiment, this difficulty during inking is overcome by using ink jet printing an ink solution onto each individual tip, or "independently addressing" each tip. The ink solution can for example be a saturated solution of MHA in acetonitrile. An illustration is provided in FIG. 8A-8B. Alternatively, the ink solution can comprise hydrophobic molecules such as lipids or ODT. Because well-defined amounts of ink can be delivered with high spatial resolution to each pen, inkjet printing is a method that allows one to overcome the irreproducibility problems associated with inking from a solution. As a result of individually addressing the tips, the ink being deposited onto the surface do not spread and touch either, thereby avoiding cross-contamination. An illustration of pattern uniformity can be found in FIG. 9.

The patterning ink composition being deposited onto a tip surface from the nozzle can be in any geometries, depending at least in part on the geometry of the nozzle used. For example, the droplets can be fairly spherical or tear shape. The droplet size can be adapted for successful ink jet printing without cross-contamination. Each droplet can have a diameter of for example between about 10 and about 200 microns.

Prevention of Substantial Cross-Contamination and Other Advantages

The array of tips and the ink jet printing can be adapted to prevent substantial cross-contamination of the patterning composition on the tips. Total prevention can be also achieved. This can be particularly important for high density tip arrays including for example embodiments wherein the tips are present with a tip density of at least 100 per square cm, or at least 500 per square cm, or at least 1,000 per square cm, or even at least 55,000 per square cm. For example, the array of tips can be adapted by controlling the spacing of the tips. The array of tips can be also adapted by the geometry of the tips positioned next to each other in different ways and positions. Two dimensional arrays of tips can be adapted by adjusting the row-to-row spacing as well as spacing within a row. In one embodiment, the array is a two-dimensional array and is characterized by tip-to-tip spacing of less than about 90 microns along a row of tips in one dimension and of less than about 90 microns between the rows of tips in another dimension.

The ink jet printing can be adapted by for example controlling the registration of the ink jet printer with respect to the array. In addition, the amount of the patterning composition which is printed onto the tips can be controlled.

The amount of the cross-contamination can be less than about 5% by weight, or less than about 1% by weight, or negligible beyond measurement. Analytical methods known in the art can be used to measure cross-contamination including for example microscopy or fluorescent methods. The ink can be measured for cross-contamination while on the tip before deposition or after deposition. If a pen is not coated by ink, and the pen does not write, this is further evidence for lack of cross-contamination.

The tips can be coated by ink jet printing so that the tip is uniformly coated, and that multiple tips can be uniformly coated.

In addition, the conditions for ink jet printing can be adapted to control the rate of deposition. For example, the amount of patterning composition can be adapted which is ink jet printed onto the tip. For example, the number of drops can be adapted. The concentration of the patterning composition can be adapted.

In particular, the ink jet printing and depositing can be carried out to produce a direct relationship between the amount of patterning composition on the tip and the transport rate.

In addition, the conditions for ink jet printing can be adapted to control the variability of deposition rate in the array of tips. The patterning composition which is ink jet printed on the tips can be disposed on the tips in substantially same amount, and deposited from the tips at substantially the same diffusion rates. For example, the patterning compositions on the tips can have a standard variation in the diffusion rates less than about 10%, or less than 5%. In addition, the size of patterned features can have a standard variation of less than about 10%, or less than 5%.

After ink jet printing, the shelf life of the tips can be measured. For example, the shelf-life can be at least 14 days or at least 30 days or at least 60 days.

Localization/Self-Correcting

Figure 5:
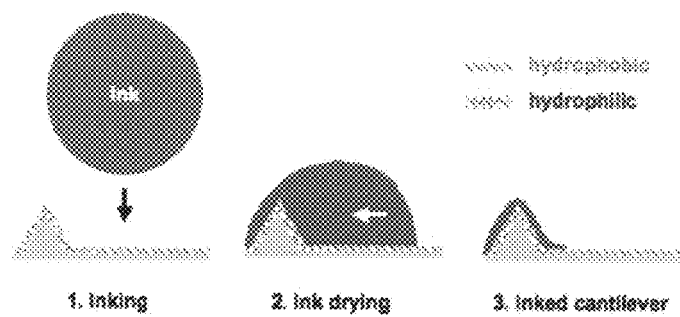
FIG. 5 provides a scheme for self-correcting inking of an anisotropically functionalized pen. The pen is functionalized in such a way that the tip area is hydrophilic (MHA functionalization) and the remaining areas are hydrophobic (ODT functionalization). Ink molecules are preferentially driven to the hydrophilic area due to differences in surface energy.

Despite the addressability afforded by inkjet printing, the spatial resolution of inking can be limited by mechanical hysteresis which limits registration of the inkjet printer with the pens in the array, the size of the nozzle, occasional droplet formation inconsistencies, and the spreading of ink on the surface.[19-21] To overcome these problems, a self-correcting inking strategy can be developed to allow the directed drying of the ink droplet based on chemical wetting and surface modification protocols[12, 26, 27] (see FIG. 5). One embodiment is to functionalize the pen anisotropically so that the tip, such as a pyramidal tip, is more hydrophilic than the remaining area (or the tip can be more hydrophobic). The anisotropic functionalization can facilitate localization of an ink droplet on the tip due to differences in surface energy. A boundary line can be formed separating the at least two regions of different hydrophilicity. The array of tips can be disposed on cantilevers, and the tips and cantilevers can be surface adapted to encourage localization of the ink composition in a particular tip area. The tips can be coated to encourage localization of the patterning composition on the tip. This is an alternative to tips which comprise a surface which has not been modified by an organic material. The ink jet printing can comprise ejecting at least one droplet to be disposed on the entire surface of the tip, followed by contraction of the droplet by drying to localize on the tip.

The tip need not be the more hydrophilic component; for example, the tip can be functionalized to be more hydrophobic than the remaining area, such as the cantilever. Further, the entire tip can be functionalized to have a different hydrophilicity compared to the cantilever. For instance, in embodiments where no cantilevers are used in the array, only the portion of the tip close to the apex needs to be functionalized to have a different hydrophilicity from the rest of the tip. The functionalization of the tip is as described in a previous section.

Figure 6:
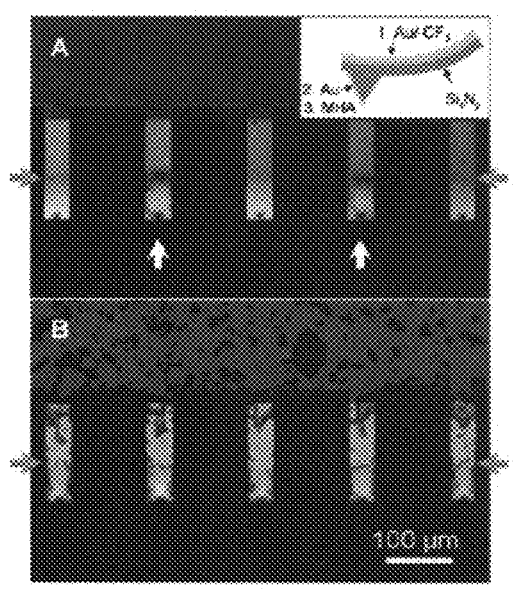
FIGS. 6A-6B show self-correcting inking of anisotropically functionalized pens. (A) Addressable inking of pens (white arrows) within a pen array by inkjet printing 3 drops of 10 mM MHA/ethanol solution (320 μL each) on each tip. The anisotropically fictionalized areas (boundary marked by red arrows) dictate where the ink droplet dried. The inset shows the anisotropic functionalization of AFM probes, which consists of three steps: 1) coating the back side with a thin layer of 20 nm Au/5 nm Ti and functionalizing with 1H,1H,2H,2H-perfluorodecanethiol, 2) coating the front side of the tip area with gold (10 nm Au/4 nm Ti) using a glass cover slip as a shadow mask, and 3) selectively functionalizing the Au-coated front side of the tip with MHA. (B) Optical micrograph of anisotropically functionalized pens dip-coated with an MHA/ethanol solution. Note that the ink is confined to the hydrophilic tip areas.
Figure 13:
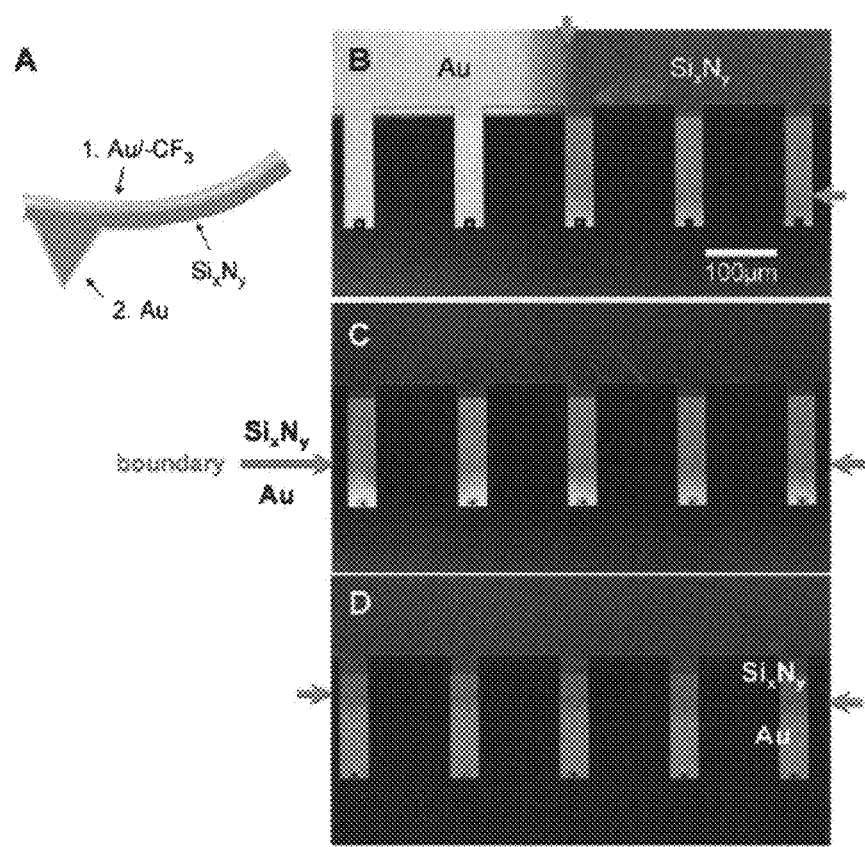
FIGS. 13A-13D illustrate anisotropically structured pens fabricated by shadow mask deposition of gold. A glass cover slide was used as a mask to expose select areas of the cantilevers for gold deposition. (A) Functionalization scheme. (B-D) Optical microscopy images showing cantilevers with varying areas coated with gold. The gold areas are brighter due to enhanced reflection. The arrows dictate the Si$_x$N$_y$—Au boundary.

In one embodiment, the tips of an array can be selectively coated with a thin layer of metal such as for example gold using a mask such as a cover slip as a shadow mask (see FIG. 13). This approach can allow one to locally functionalize the tip area with a patterning composition comprising for example MHA through for example alkanethiol-gold chemistry[11] (FIG. 6). In one embodiment, because the gold deposition step can be integrated into the mold-and-transfer pen microfabrication process,[4, 28] this anisotropic functionalization strategy can be conveniently applied to both individual AFM cantilevers and pen arrays.[4] Using this approach and an inkjet printer to deliver, for example, 320 pL droplets onto individual pens within the array, such structures can be selectively addressed without contaminating neighboring pens, or "cross-contamination" (FIG. 6A). The droplets can be of any relevant volume, adapted to make the process work for a particular application. For example, it can be less than 1000 pL or greater than 1000 pL. It can be less than 750 pL, such as less than 500 pL.

It is generally desirable to have the ink droplet localized within the functionalized tip area. In one embodiment where the tip is functionalized by MHA, the functionalized area is less than 2% of the total footprint area for an MHA/ethanol droplet drying on a MHA-functionalized gold substrate. This experiment, however, does not show the selective ink localization from the cantilever arm to the tip. In one embodiment, as shown in optical microscopy, as the droplet dries, the ink can move from the hydrophobic cantilever arm to the hydrophilic tip. The liquid film breaks up at the hydrophobic-hydrophilic boundary, thereby confining the ink to the tip area (FIG. 6B). A control experiment shows that the ink dries randomly on native silicon nitride cantilevers.

The tip can be treated by methods known in the art which include lithographic and patterning steps. The backside of a cantilever can be functionalized as known in the art.

In an alternative embodiment where phospholipids are used in the patterning composition, the phospholipids ink droplets can be found to be better confined to the tips by functionalizing the gold-coated pens with a hydrophobic molecule, ODT; the droplet footprints decreased about 50% compared to those on hydrophilic MHA-functionalized surfaces.

Another embodiment provides a device comprising an array of cantilevers, the cantilevers having a tip thereon, wherein the cantilevers and tip are adapted to encourage localization of a deposited ink jet drop onto the tip. Localization can be encouraged with use of a hydrophilic-hydrophobic boundary.

Localization can be also applied to other structures such as for example ink wells or structures like tips like posts as described in U.S. Pat. No. 7,034,854.

Contact Printer Surface

Contact printing methods are known in the art, including soft lithography and direct writing arts, including for example DPN printing with tips and microcontact printing with stamps. In contact printing, the ink flows or is otherwise deposited from a contact printer surface to a substrate surface, whether by serial or parallel processes.

The self-correcting method needs not be used only with ink-jet printing ink compositions as described. For example, the independently addressed tip can be used without self-correcting method. Similarly, self-corrected functionalized tips need not be used only for lithography where the tips are independently addressed. Further, the deposition method to transfer the ink from the tips onto a substrate needs not be of a particular type. For instance, the deposition method can be DPN or micro contact printing.

The contact printer surface can comprise an aperture. Or it can comprise an elongated beam comprising an aperture.

Additional embodiments are provided in the following non-limiting working examples.

NON-LIMITING WORKING EXAMPLES

Materials and Methods

Materials. 16-mercaptohexadecanoic acid (MHA, 90%), 1-octadecanethiol (ODT, 98%), and ethanol (200 proof, HPLC grade) were purchased from Sigma-Aldrich. Ti (99.7%) and Au (99.99%) wires were purchased from Alfa Aesar, Ward Hill. All phospholipids were purchased from Avanti Polar Lipids, Inc. and include 1,2-Dioleoyl-sn-Glycero-3-Phosphocholine (DOPC), 1,2-Dioleoyl-sn-Glycero-3-Phosphoethanolamine-N-(Lissamine Rhodamine B Sulfonyl) Ammonium Salt (Rhodamine), 1,2-Dioleoyl-sn-Glycero-3-Phosphoethanolamine-N-(5-dimethylamino-1-naphthalenesulfonyl) (Dansyl), and 1,2-Dioleoyl-sn-Glycero-3-Phosphoethanolamine-N-(Carboxyfluorescein) (Fluorescein).

Inkjet Printing. Inkjet printing was carried out using a drop-on-demand micro-dispensing system (Piezorray™, Perkin Elmer, Inc., Waltham, Mass.) with an 85-μm piezoelectric-controlled nozzle that dispenses 320 pL droplets. The droplet formation was controlled by adjusting the voltage and pulse width dispensing conditions (70 V, 40 μsec), which could be monitored in real time using a CCD camera. The system was enclosed in an environmental chamber, and the X-Y positional accuracy was 25 μm. Ink solutions included MHA in ethanol (0.5-10 mM), DOPC phospholipids in water (multilamellar vesicles at 10 g/L with 1 wt % fluorophore-labeled lipids), and saturated MHA-acetonitrile solutions.

Dip-Pen Nanolithography. DPN experiments were performed with an NScriptor™ (NanoInk, Inc., Skokie, Ill.) or an AFM (CP-III, Veeco/Thermomicroscopes, Sunnyvale, Calif.) equipped with a 100-μm scanner and closed-loop scan control. All DPN patterning experiments were carried out under controlled environments (~40-75% relative humidity, 20-24° C.). Polycrystalline Au films were prepared by thermal evaporation of 5-10 nm of Ti on $SiO_x$ followed by 25 nm of Au at a rate of 1 Å/s and a base pressure of $\leq 5 \times 10^{-6}$ Torr.

Example 1

Independently Addressing Tips in An Array

Figure 2:
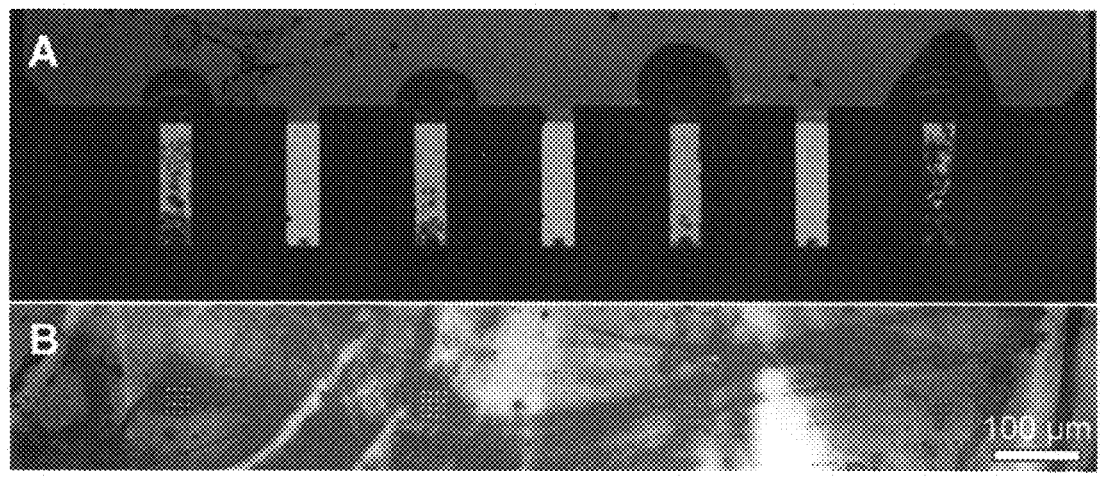
FIGS. 2A-2B illustrate addressable inking of a 1D pen array. (A) Optical image of a 1D pen array with alternating pens inked with 1 drop of MHA-ethanol solution (10 mM, 320 pL) and (B) the corresponding gold nanostructures patterned with the inked pen array.

Inkjet printing was demonstrated to allow one to address each pen independently within an array. Using a remote piezoelectric-controlled nozzle, the inkjet printer can directly deliver pico- to nano-liter volumes of ink to each pen. In air, the droplet diameters range from 40 to 100 μm, but increase to several hundred microns when they hit the substrate.[19-22] This inking protocol allows for the delivery of a large number of chemically distinct inks to each or several pens within a 1D or 2D pen array. To evaluate this approach, the ability to address and coat every other pen in a 7-pen 1D array with an MHA/ethanol solution (10 mM, ~320 pL droplets) was studied, as shown in FIG. 2A. This ink-coated pen array was then used in a DPN experiment to generate a 4×4 array of 1.5 μm diameter MHA features on a gold thin film substrate. Subsequent etching of the exposed gold left raised features that could be easily characterized by optical microscopy; see FIG. 2B. Note that only the four inked cantilevers produced patterns. This experiment demonstrates that cantilevers spaced 150 μm apart were addressed without cross-contamination.

It was also found that delivering the same amount of MHA ink to different pens within an array using inkjet printing yields pattern features similar in size. Pattern sizes were measured by in situ lateral force microscopy (LFM) of the MHA patterns, by examining the aforementioned raised gold structures via optical microscopy, and also by atomic force microscopy (AFM). The standard deviation of feature sizes generated by four different pens within the same array is 4.4±1.4% and increased only slightly among different pen arrays, to 4.8±0.7%. This size variation was very small compared to dip-coated pen arrays, whose ink diffusion rates can vary by more than 10% from pen to pen (standard deviation) and are arbitrary from array to array. The inked pen arrays had a shelf life of at least one month and can generate high quality features down to 100 nm with less than a 10% feature size variation. Optical microscopy images of variations of feature sizes are for example found in FIG. 10A-10D. These experiments confirm that the large variation in diffusion rates associated with a pen array inked by dip-coating in a solution mainly arose from inhomogeneous ink distribution on the pens.

Figure 3:
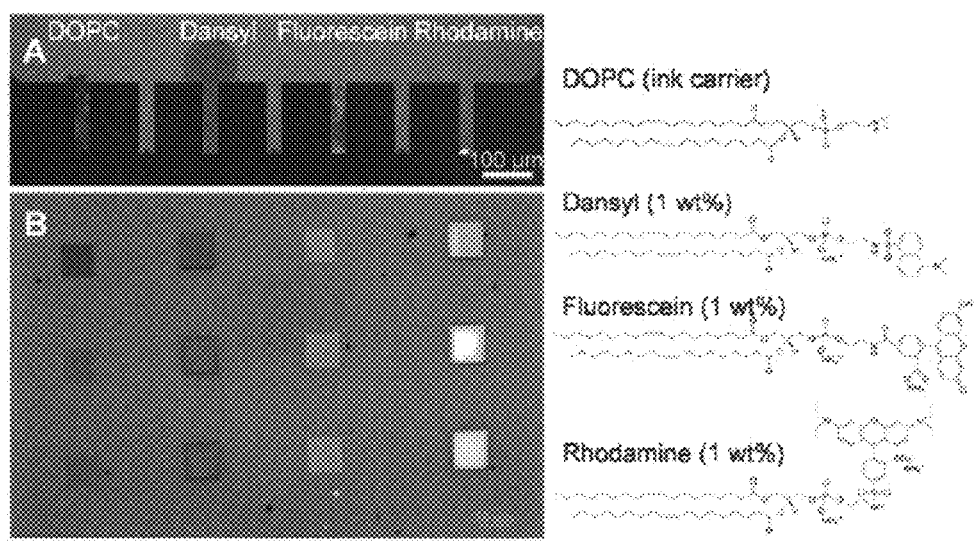
FIGS. 3A-3B shows fluorescent images showing individually addressable, multiplexed inking of a 1D pen array with phospholipids. (A) A pen array inked with four different fluorophore-labeled phospholipids (structures shown on the right). (B) Corresponding multiplexed patterns written on a glass slide.

To evaluate the prospects for multiplexing, alternating cantilevers within a 7-pen array, each with different fluorophore-labeled phospholipids were inked by programming a single inkjet nozzle to go through cycles of aspiration, dispensing (inking), and cleaning for each of the four inks (FIG. 3A). The inked pen array was subsequently used to pattern four different inks in arrays of squares. Each square was 10 μm and made of 300 nm parallel line features. Significantly, the pen spacing was 150 μm, but using this technique and a mechanical stage, one can move pens in and out of the normal AFM field of view (90 μm×90 μm), allowing one to construct structures made of different materials in one field of view (FIG. 3B). This pattern demonstrates that inkjet printing has enabled multiplexed DPN with multiple inks.[2, 3, 16]

Figure 4:
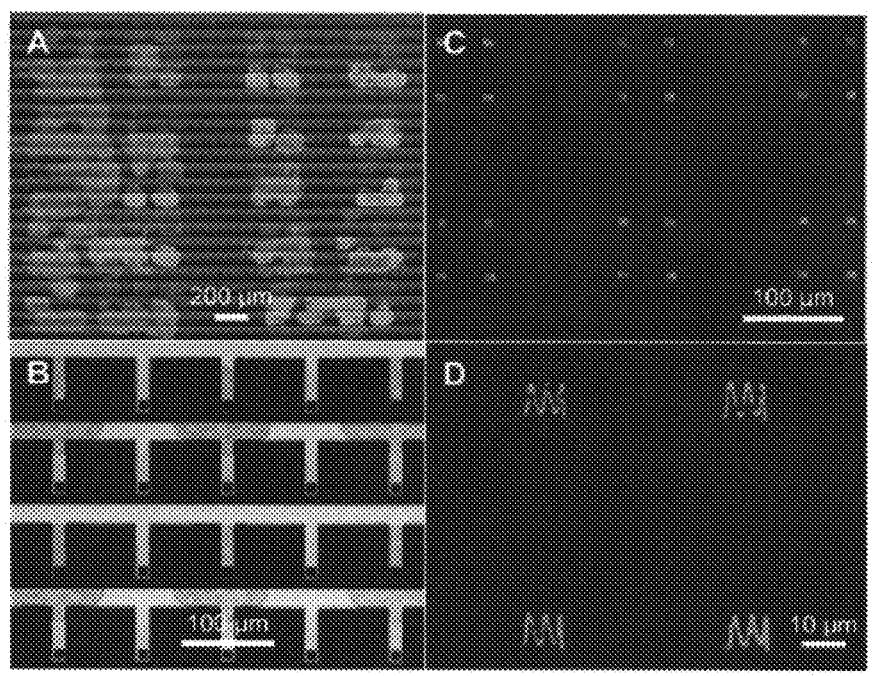
FIGS. 4A-4D illustrate addressable inking of 2D pen arrays with phospholipids. (A) Four fluorophore-labeled phospholipids printed on a 2D pen array (90 μm×20 μm spacing). (B) Rhodamine-labeled phospholipid addressed to every other pen in a 2D array (90×90 μm spacing) and (C, D) Corresponding 700 nm linewidth patterns written on a glass slide. Note that the cross-talk problem encountered in (A) is eliminated when the pen-to-pen spacing is increased to 90 μm×90 μm.
Figure 11:
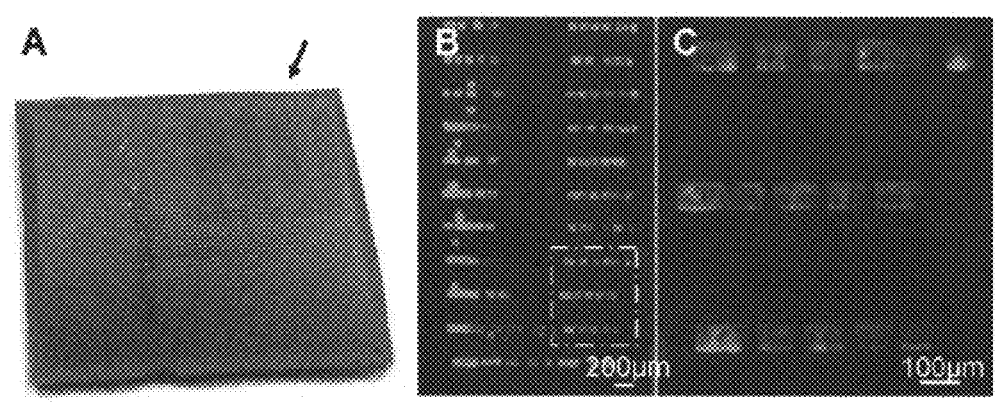
FIGS. 11A-11B show phospholipids printed on a 55,000-pen 2D array with the pattern "NU". (A) Optical image. (B) Fluorescent microscopy images showing the rhodamine labeled DOPC ink making up the "U" pattern. Here the 2D pen array was on a SiO$_2$ support The cantilevers were coated with titanium/gold and annealed to induce bending, following a published protocols. The back sides of the cantilevers and SiO$_2$ support were functionalized with octyltrichlorosilane (OTS, 1 vol % in hexane for 30 minutes), while the front sides were functionalized with 11-amino-1-undecanethiol (AUT, 1 mM in ethanol for 20 minutes). This functionalization renders the back side of the cantilevers and the SiO$_2$ support hydrophobic, thereby preventing capillary action that causes the cantilevers to adhere to the SiO$_2$ support.

Multiplexed inking of two dimensional arrays with multiple fluorophore-labeled phospholipids is also possible. In a proof-of-concept experiment, the gold-coated tips of a 55,000-pen 2D array[4, 5] were functionalized with 1-mercaptoundecanol, and the remaining areas (silicon nitride and silicon/$SiO_2$) were passivated with 1-octadecyltrichlorosilane (OTS). This chemical modification step overcomes the capillary action-driven stiction of inked cantilevers to the silicon/$SiO_2$ support (see FIG. 12). In one experiment, fluorophore-labeled phospholipids were printed on one quadrant of a 55,000-pen 2D array in the pattern of "NU" (FIG. 4A and FIG. 11). The inked pen array was subsequently used for DPN patterning. Due to the 20 μm spacing between the adjacent pens of this 2D array, each inkjet droplet covered 5-7 pens rather than one. Moreover, the inking was not perfectly uniform due to the spreading of droplets once they hit the substrate. Both of these issues can be addressed by increasing the pen-to-pen spacing in the array. Indeed, as proof of concept, single pen addressability was achieved by using a 2D pen array with 90 μm×90 μm pen-to-pen spacing (FIGS. 4B-D). Note that the phospholipid ink droplets were better confined to the tips by functionalizing the gold-coated pens with a hydrophobic molecule, ODT; the droplet footprints decreased ~50% compared to those on hydrophilic MHA-functionalized surfaces.

Despite the addressability afforded by inkjet printing, the spatial resolution of inking is limited by mechanical hysteresis which limits registration of the inkjet printer with the pens in the array, the size of the nozzle (~85 μm diameter for the system used herein), occasional droplet formation inconsistencies, and the spreading of ink on the surface.[19-21] To overcome these problems, a self-correcting inking strategy was developed to allow the directed drying of the ink droplet based on chemical wetting and surface modification protocols[12, 26, 27] (see FIG. 5). The basic idea was to functionalize the pen anisotropically so that the pyramidal tip is hydrophilic and the remaining area is hydrophobic. The anisotropic functionalization facilitates localization of an ink droplet on the hydrophilic tip due to differences in surface energy.

The tips of an array were we selectively coated with a thin layer of gold using a cover slip as a shadow mask (see FIG. 13). This approach allows one to locally functionalize the tip area with MHA through alkanethiol-gold chemistry[11] (FIG.

6). Because the gold deposition step can be integrated into the mold-and-transfer pen microfabrication process,[4, 28] this anisotropic functionalization strategy can be conveniently applied to both individual AFM cantilevers and pen arrays.[4] Using this approach and an inkjet printer to deliver 320 pL droplets onto individual pens within the array, such structures could be selectively addressed without contaminating neighboring pens (FIG. 6A). The ink droplet was localized within the MHA-functionalized tip area, an area which is less than 2% of the total footprint area for an MHA/ethanol droplet drying on a MHA-functionalized gold substrate. This experiment, however, does not show the selective ink localization from the cantilever arm to the tip. To evaluate localization, a 0.2 µL droplet of 2 mM MHA/ethanol solution was deposited on the cantilever and tip areas of a 7-pen array (FIG. 6B, five pens shown). Optical microscopy showed that as the droplet dried, the ink moved from the hydrophobic cantilever arm to the hydrophilic tip. The liquid film broke up at the hydrophobic-hydrophilic boundary, thereby confining the ink to the tip area (FIG. 6B). A control experiment showed that the ink dried randomly on native $Si_xN_y$ cantilevers.

Figure 7:
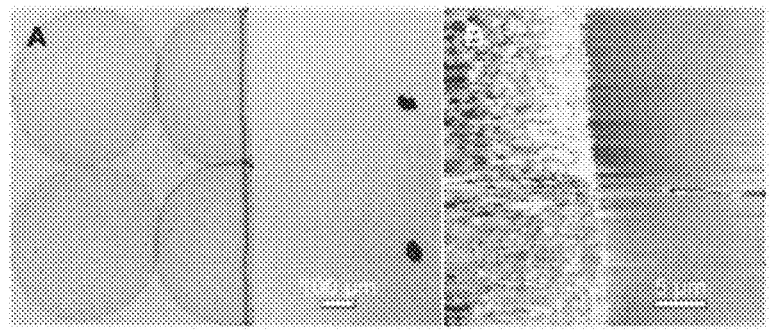
FIGS. 7A-7B show footprints of inkjet droplets on and near a hydrophobic-hydrophilic boundary. (A) A representative optical image showing the footprints of MHA ink droplets (320 pL, 10 mM in ethanol) printed near the MHA-ODT boundary. The footprint radii are 233.3±6.2 μm for MHA (left) and 35.7±3.7 μm for ODT (right). When a droplet hits the hydrophobic-hydrophilic boundary, the portion on the hydrophobic side is driven and localized to the MHA side (center). (B) AFM image showing MHA was completely localized to the hydrophilic side.

In another experiment, a gold-on-silicon substrate (25 nm gold/5 nm Ti/$SiO_x$/Si) was modified with a monolayer of ODT, followed by a second deposition of gold on an area not covered by a glass cover slip. The second gold area was functionalized with MHA. This procedure creates a sharp boundary between the hydrophobic and hydrophilic portions of the substrate. An array of 10 mM MHA/ethanol ink droplets were deposited directly on and near the boundary, with varying droplet-boundary distances. For the droplets that were within 230 µm of the boundary but on the ODT side, the ink droplets all moved to the MHA side of the substrate (FIG. 7). Therefore, one does not have to perfectly address the tips of an array to get uniform tip inking because the ink on the cantilever arm moves to the tip.

Drying of a 0.2 microliter droplet of 0.2 mM MHA-ethanol solution on an anisotropically functionalized seven pen array was captured by movie at a speed of 1 frame per second with each frame taken at five second intervals.

The following references are cited to above and are hereby incorporated by reference in their entireties and provide further enabling support for practicing the claimed embodiments.

REFERENCES

[1] R. D. Piner, J. Zhu, F. Xu, S. H. Hong, C. A. Mirkin, Science 1999, 283, 661.
[2] D. S. Ginger, H. Zhang, C. A. Mirkin, Angew. Chem. Int. Ed. 2004, 43, 30.
[3] K. Salaita, Y. Wang, C. A. Mirkin, Nature Nanotech. 2007, 2, 145.
[4] K. Salaita, Y. Wang, J. Fragala, R. A. Vega, C. Liu, C. A. Mirkin, Angew. Chem. Int. Ed. 2006, 45, 7220.
[5] S. Lenhert, P. Sun, Y. Wang, H. Fuchs, C. A. Mirkin, Small 2007, 3, 71.
[6] M. Lee, D.-K. Kang, H.-K. Yang, K.-H. Park, S. Y. Choe, C. Kang, S.-I. Chang, M. H. Han, I.-C. Kang, Proteomics 2006, 6, 1094.
[7] K.-B. Lee, E.-Y. Kim, C. A. Mirkin, S. M. Wolinsky, Nano Letters 2004, 4, 1869.
[8] H. Chen, J. Li, Methods in Molecular Biology 2007, 381, 411.
[9] C. Wingren, L. Montelius, C. A. K. Borrebaeck, Protein Microarrays 2005, 339.
[10] K. D. Mossman, G. Campi, J. T. Groves, M. L. Dustin, Science 2005, 310, 1191.
[11] J. C. Love, L. A. Estroff, J. K. Kriebel, R. G. Nuzzo, G. M. Whitesides, Chem. Rev. 2005, 105, 1103.
[12] Y. Wang, D. Maspoch, S. Zou, G. C. Schatz, R. E. Smalley, C. A. Mirkin, Proc. Nat. Acad. Sci. USA. 2006, 103, 2026.
[13] C. D. Blanchette, T. V. Ratto, M. L. Longo, in Principles of Cellular Engineering: Micromechanics at the Biomolecular Interface (Ed.: M. R. King), Elsevier, 2006, pp. 195.
[14] M. M. Stevens, J. H. George, Science 2005, 310, 1135.
[15] K. L. Christman, V. D. Enriquez-Rios, H. D. Maynard, Soft Matter 2006, 2, 928.
[16] S. H. Hong, J. Zhu, C. A. Mirkin, Science 1999, 286, 523.
[17] B. Rosner, T. Duenas, D. Banerjee, R. Shile, N. Amro, J. Rendlen, Smart Mater. Struct. 2006, 15, S124.
[18] S. Sekula, J. Fuchs, S. Weg-Remers, P. Nagel, S. Schuppler, J. Fragala, N. Theilacker, M. Franzreb, C. Wingren, P. Ellmark, C. A. K. Borrebaeck, C. A. Mirkin, H. Fuchs, S. Lenhert, Small submitted.
[19] P. Calvert, Chem. Mater. 2001, 13, 3299.
[20] H. Sirringhaus, T. Shimoda, MRS Bull. 2003, 28, 802.
[21] F. G. Zaugg, P. Wagner, MRS Bull. 2003, 28, 837.
[22] B.-J. de Gans, E. Kazancioglu, W. Meyer, U. S. Schubert, Macromol. Rapid Commun. 2004, 25, 292.
[23] S. Rozhok, R. Piner, C. A. Mirkin, J. Phys. Chem. B 2003, 107, 751.
[24] R. Valiokas, S. Vaitekonis, G. Klenkar, G. Trinkunas, B. Liedberg, Langmuir 2006, 22, 3456.
[25] E. J. Peterson, B. L. Weeks, J. J. De Yoreo, P. V. Schwartz, J. Phys. Chem. B 2004, 108, 15206.
[26] K. Kargupta, A. Sharma, Phys. Rev. Lett. 2001, 86, 4536.
[27] A. Sehgal, V. Ferreiro, J. F. Douglas, E. J. Amis, A. Karim, Langmuir 2002, 18, 7041.
[28] J. Zou, X. Wang, D. Bullen, K. Ryu, C. Liu, C. A. Mirkin, J. Micromech. Microeng. 2004, 14, 204.

What is claimed is:

1. A method comprising:
providing at least one array of tips;
providing at least two patterning compositions different from each other;
ink jet printing at least two of the different patterning compositions onto at least some of the tips; and
depositing at least some of the ink jet printed patterning compositions onto a substrate surface;
wherein the array of tips and the ink jet printing are adapted to prevent substantial cross-contamination of the patterning composition on the tips.

2. The method of claim 1, wherein the tips are present with a tip density of at least 1,000 per square centimeter.

3. The method of claim 1, wherein the array of tips is adapted by controlling the spacing of the tips.

4. The method of claim 1, wherein the array of tips is a two dimensional array of tips and is adapted by controlling the spacing of the tips in each dimension.

5. The method of claim 1, wherein the ink jet printing is adapted by controlling the registration of the ink jet printer with respect to the array.

6. The method of claim 1, wherein the ink jet printing is adapted by controlling the amount of patterning composition which is ink jet printed onto the tips.

7. The method of claim 1, wherein the prevention of cross-contamination is sufficient that the amount of cross-contamination is less than about 5% by weight.

8. The method of claim 1, wherein the prevention of substantial cross-contamination is measured by microscopy.

9. The method of claim 1, wherein the array of tips are disposed on cantilevers, and the tips and cantilevers are surface adapted to encourage localization of the ink composition in a tip area.

10. The method of claim 1, wherein the array of tips is a two-dimensional array.

11. The method of claim 1, wherein the array of tips further comprises a plurality of cantilevers onto which the tips are disposed.

12. The method of claim 1, wherein the array of tips is characterized by a tip spacing of less than about 150 microns.

13. The method of claim 1, wherein the array is a two-dimensional array and is characterized by a tip-to-tip spacing of less than about 90 microns along a row of tips in one dimension and of less than about 90 microns between the rows of tips in another dimension.

14. The method of claim 1, wherein the tips are scanning probe microscope tips.

15. The method of claim 1, wherein the tips are atomic force microscope tips.

16. The method of claim 1, wherein the amount of the patterning composition being ink jet printed onto a tip is smaller than about 500 pL.

17. The method of claim 1, wherein depositing is carried out with simultaneously depositing at least two different ink compositions.

18. The method of claim 1, wherein the tips are coated to encourage localization of the patterning composition on the tip.

19. The method of claim 1, wherein the ink jet printing is controlled so that the tip is uniformly coated.

20. The method of claim 1, wherein ink jet printing comprises ejecting at least one droplet to be disposed on the entire surface of the tip, followed by contraction of the droplet by drying to localize on the tip.

21. A method comprising:
ink jet printing at least one patterning composition onto at least one tip; and
depositing the ink jet printed patterning composition onto a substrate surface at a deposition rate;
wherein the conditions for ink jet printing are adapted to control the rate of deposition.

22. The method of claim 21, wherein the conditions adapted include the amount of patterning composition ink jet printed onto the tip.

23. The method of claim 21, wherein the conditions adapted include the number of ink drops which are ink jetted onto the tip.

24. The method of claim 21, wherein the conditions adapted include increasing the number of ink drops sufficiently to provide a uniform tip coating.

25. The method of claim 21, wherein the conditions adapted include the concentration of patterning composition.

26. The method of claim 21, wherein the ink jet printing and depositing are carried out to produce a direct relationship between the amount of patterning composition on the tip and the transport rate.

27. The method of claim 21, wherein the tip is disposed on a cantilever.

28. The method of claim 21, wherein the tip is one of an array of tips.

29. The method of claim 21, wherein the tip is an AFM tip.

30. The method of claim 21, wherein the tip is a scanning probe tip.

31. The method of claim 21, wherein the tip is a nanoscopic tip.

32. The method of claim 21, wherein the tip is a solid tip.

33. The method of claim 21, wherein the tip is disposed on a cantilever.

34. The method of claim 21, wherein the tip after ink jet printing has a shelf-life of at least about 30 days.

35. The method of claim 21, wherein the ink jet printing is performed with at least one piezoelectric-controlled nozzle.

36. The method of claim 21, wherein the tip is disposed on a cantilever to form a structure, and the structure is treated to encourage localization of the ink onto the tip.

37. The method of claim 21, wherein the tip is disposed on a cantilever to form a structure, and the structure is treated to provide at least two regions of different hydrophilicity to encourage localization of the ink onto the tip.

38. The method of claim 21, wherein the tip is disposed on a cantilever to form a structure, and the structure is surface treated with a monolayer to provide at least two regions of different hydrophilicity to encourage localization of the ink onto the tip.

39. The method of claim 21, wherein at least part of the tip is rendered hydrophilic or hydrophobic.

40. The method of claim 21, wherein the tip is functionalized to have different hydrophilicities in different portion of the tip.

41. A method comprising:
ink jet printing at least one patterning composition onto at least one array of tips comprising at least two tips; and
depositing the patterning composition from the tips onto a substrate surface to form a plurality of features;
wherein the conditions for ink jet printing are adapted to control the variability of deposition rate in the array of tips.

42. The method of claim 41, wherein the array is a one-dimensional array.

43. The method of claim 41, wherein the array is a two-dimensional array.

44. The method of claim 41, wherein the array further comprises at least one cantilever.

45. The method of claim 41, wherein at least some of the tips are disposed on cantilevers.

46. The method of claim 41, wherein the patterning composition which is ink jet printed on the tips is disposed on the tips in substantially the same amount.

47. The method of claim 41, wherein the patterning composition which is ink jet printed on the tips is deposited from the tips at substantially the same diffusion rates.

48. The method of claim 41, wherein the tips after ink jet printing have a shelf-life of at least about one month.

49. The method of claim 41, wherein the tips are scanning probe microscope tips.

50. The method of claim 41, wherein the tips are atomic force microscope tips.

51. The method of claim 41, wherein the tip comprises a surface which has not been modified by an organic material.

52. The method of claim 41, wherein the patterning compositions on the tips provide substantially the same diffusion rates upon deposition.

53. The method of claim 41, wherein the patterning compositions on the tips have a standard variation in the diffusion rates less than about 10%.

54. The method of claim 41, wherein the features are about 100 nm to about 10 microns.

55. The method of claim 41, wherein the features are 10 nm to about one micron.

56. The method of claim 41, wherein the sizes of the features have a standard variation less than about 10%.

57. The method of claim 41, wherein the patterning composition diffusion is controlled by functionalization of the tips.

58. The method of claim 41, wherein the tips have been treated to encourage localization of the ink jet printed composition.

59. The method of claim 41, wherein the tips have been treated to become more hydrophilic or more hydrophobic.

60. The method of claim 41, wherein the tips are disposed on cantilevers and both the tips and the cantilevers have been treated to encourage localization of the ink jet printed composition on the tips.

61. A method comprising:
ink jet printing at least one patterning composition onto at least one tip in at least one array, wherein the tip has been treated to encourage localization of the patterning composition on the tip.

62. The method of claim 61, wherein tip has been treated to become more hydrophilic or more hydrophobic.

63. The method of claim 61, wherein the tip is disposed on a cantilever.

64. The method of claim 61, wherein the tip is disposed on a cantilever, and the cantilever and the tip are treated to encourage localization of the patterning composition on the tip.

65. The method of claim 61, wherein the tip is treated with a monolayer.

66. The method of claim 61, wherein the tip is substantially more hydrophilic than area surrounding the tip.

67. The method of claim 61, wherein the tip is substantially less hydrophilic than area surrounding the tip.

68. The method of claim 61, wherein the tip is disposed on a cantilever, and the cantilever is more hydrophilic than the tip.

69. The method of claim 61, wherein the tip is disposed on a cantilever, and the cantilever is more hydrophobic than the tip.

70. The method of claim 61, wherein the treatments which provide for different hydrophilicities is created by anisotropic functionalization.

71. The method of claim 61, wherein the tip has been treated by methods which include lithography.

72. The method of claim 61, wherein the tip has been treated by methods which include coating the tip with a film.

73. The method of claim 61, wherein the tip is disposed on a cantilever and a backside of the cantilever is further functionalized.

74. The method of claim 61, wherein the tip is an atomic force microscope tip.

75. The method of claim 61, wherein the tip is a nanoscopic tip.

76. The method of claim 61, wherein the array is a one-dimensional or a two-dimensional array.

77. The method of claim 61, wherein the ink jet printing is performed by a nozzle with a diameter of about 100 microns or less.

78. The method of claim 61, wherein an array of tips used and the ink jet printing are adapted to prevent substantial cross-contamination of a plurality of patterning composition on the tips.

79. The method of claim 61, wherein an array of tips is used adapted by controlling the spacing of the tips to prevent substantial cross-contamination.

80. The method of claim 61, wherein the ink jet printing is adapted by controlling the registration of the ink jet printer.

81. A method comprising:
providing a contact printer surface,
disposing at least one patterning composition onto the contact printer surface; and
depositing at least some of the disposed patterning composition from the contact printer surface to a substrate;
wherein the contact printer surface is treated so as to encourage the localization of the patterning composition to a desired location on the surface.

82. The method of claim 81, wherein the disposing step is carried out by inkjet printing.

83. The method of claim 81, wherein the contact printer surface is adapted for a soft lithography method.

84. The method of claim 81, wherein the contact printer surface is a stamp surface for microcontact printing.

85. The method of claim 81, wherein the contact printer surface is a tip for direct write deposition.

86. The method of claim 81, wherein the contact printer surface comprises an array of cantilevers.

87. The method of claim 81, wherein the contact printer surface comprises an array of cantilevers, the cantilevers comprising tips thereon.

88. The method of claim 81, wherein the contact printer surface comprises an array of cantilevers, the cantilevers comprising AFM tips thereon.

89. The method of claim 81, wherein the contact printer surface is a nanoscopic tip.

90. The method of claim 81, wherein the contact printer surface is a scanning probe tip.

91. The method of claim 81, wherein the contact printer surface comprises an aperture.

92. The method of claim 81, wherein the contact printer surface comprises an elongated beam comprising an aperture.

93. The method of claim 81, wherein the contact printer surface is a solid tip.

94. The method of claim 81, wherein the contact printer surface is an AFM tip.

95. The method of claim 81, wherein the contact printer surface encourages localization by a boundary line between two regions with different hydrophilicities.

96. The method of claim 81, wherein the contact printer surface comprises a tip which has been treated to encourage localization of the patterning composition on the tip.

97. The method of claim 81, wherein the contact printer surface comprises a two-dimensional array of tips.

98. The method of claim 81, wherein the contact printer surface comprises a two-dimensional array of tips having a tip density of at least 3,000 tips per square centimeter.

99. The method of claim 81, wherein the disposing step is an ink jet printing step and the contact printer surface comprises an array of cantilevers with AFM tips thereon.

100. The method of claim 81, wherein the disposing step is an ink jet printing step and the contact printer surface comprises an array of cantilevers with AFM tips thereon, and the array has a tip spacing of less than about 100 microns.

101. A device comprising an array of cantilevers, the cantilevers having a tip thereon, wherein the cantilevers and tip are adapted to encourage localization of a deposited ink jet drop onto the tip.

102. The device of claim 101, wherein the localization is encouraged with use of a hydrophilic-hydrophobic boundary.

103. The device of claim 101, wherein the tips are AFM tips.

104. The device of claim 101, wherein the array is a two-dimensional array.

105. The device of claim 101, wherein the array has a cantilever spacing adapted to prevent cross-contamination of patterning compositions which are deposited by ink jet printing.

106. The device of claim 101, wherein the tips are elastomeric tips.

107. The device of claim 101, wherein the tips are solid tips.

108. The device of claim 101, wherein the tips are fountain pen tips.

109. A method comprising:
providing an ink well,
disposing at least one patterning composition onto the ink well surface; and
wherein the ink well surface is treated so as to encourage the localization of the patterning composition to a desired location on the surface.

* * * * *